(12) United States Patent
Kanakasabai et al.

(10) Patent No.: US 12,206,256 B2
(45) Date of Patent: Jan. 21, 2025

(54) WIRELESS POWER TRANSFER WITH LOAD SHARING RECEIVERS

(71) Applicant: GE Hybrid Technologies, LLC, Niskayuna, NY (US)

(72) Inventors: Viswanathan Kanakasabai, Bangalore (IN); Suma Memana Narayana Bhat, Bangalore (IN); Jayanti Ganesh, Bangalore (IN); Rupam Basak, Howrah (IN)

(*) Notice: Subject to any disclaimer, the term of this patent is extended or adjusted under 35 U.S.C. 154(b) by 0 days.

(21) Appl. No.: 17/755,940

(22) PCT Filed: Nov. 10, 2020

(86) PCT No.: PCT/US2020/059851
§ 371 (c)(1),
(2) Date: May 12, 2022

(87) PCT Pub. No.: WO2021/096866
PCT Pub. Date: May 20, 2021

(65) Prior Publication Data
US 2022/0385112 A1  Dec. 1, 2022

(30) Foreign Application Priority Data
Nov. 12, 2019 (IN) .............................. 201911045900

(51) Int. Cl.
*H02J 50/40* (2016.01)
*G01R 19/10* (2006.01)
(Continued)

(52) U.S. Cl.
CPC ............ *H02J 50/402* (2020.01); *G01R 19/10* (2013.01); *H02J 50/10* (2016.02); *H02J 50/80* (2016.02); *H02J 50/90* (2016.02)

(58) Field of Classification Search
CPC .......... H02J 50/402; H02J 50/10; H02J 50/80; H02J 50/90; G01R 19/10
See application file for complete search history.

(56) References Cited

U.S. PATENT DOCUMENTS 5,995,900 A    11/1999  Hsiao et al.
6,803,744 B1   10/2004  Sabo
(Continued)

FOREIGN PATENT DOCUMENTS

FR      2974952      11/2012
JP    2008259335     10/2008
(Continued)

OTHER PUBLICATIONS

"PCT Application No. PCT/US2020/059851 International Search Report and Written Opinion", Feb. 5, 2021, 13 pages.
(Continued)

*Primary Examiner* — Daniel Cavallari
(74) *Attorney, Agent, or Firm* — DeLizio, Peacock, Lewin & Guerra LLP

(57) ABSTRACT

This disclosure provides systems, devices, apparatus and methods, including computer programs encoded on storage media, for wireless power transmission. A wireless power receiving apparatus may be configured to combine power from multiple wireless power signals. In some implementations, the wireless power receiving apparatus may combine wireless power received from multiple secondary coils to provide a combined wireless power signal to a load, such as a battery charger or electronic device. In some implementations, each set of primary coil and secondary coil may utilize low power wireless power signals (such as 15 Watts or less) in accordance with a wireless charging standard. By combining power from multiple low power wireless power signals, the wireless power receiving apparatus may support higher power requirements of an electronic device. The (Continued)

disclosed designs may minimize electromagnetic interference (EMI) and provide greater efficiency of wireless power transfer.

30 Claims, 18 Drawing Sheets

(51) Int. Cl.
*H02J 50/10* (2016.01)
*H02J 50/80* (2016.01)
*H02J 50/90* (2016.01)

(56) References Cited

U.S. PATENT DOCUMENTS

| | | | |
|---|---|---|---|
| 8,629,654 | B2 | 1/2014 | Partovi et al. |
| 9,112,363 | B2 | 8/2015 | Partovi |
| 9,130,394 | B2 | 9/2015 | Burdo et al. |
| 9,190,876 | B2 | 11/2015 | Mayo et al. |
| 9,252,628 | B2 | 2/2016 | Leabman et al. |
| 9,409,490 | B2 | 8/2016 | Kawashima |
| 9,796,280 | B2 | 10/2017 | McCool et al. |
| 9,837,846 | B2 | 12/2017 | Partovi |
| 9,912,173 | B2 | 3/2018 | Tseng |
| 10,008,887 | B2 | 6/2018 | Zeine |
| 10,044,229 | B2 | 8/2018 | Partovi et al. |
| 10,148,097 | B1 | 12/2018 | Leabman et al. |
| 2007/0182367 | A1 | 8/2007 | Partovi |
| 2011/0199028 | A1 | 8/2011 | Yamazaki et al. |
| 2011/0304220 | A1 | 12/2011 | Whitehead |
| 2012/0139358 | A1 | 6/2012 | Teggatz et al. |
| 2012/0262108 | A1 | 10/2012 | Olson et al. |
| 2013/0043734 | A1 | 2/2013 | Stone et al. |
| 2013/0069586 | A1 | 3/2013 | Jung et al. |
| 2013/0249479 | A1 | 9/2013 | Pastovi |
| 2014/0191568 | A1 | 7/2014 | Partovi |
| 2014/0203769 | A1 | 7/2014 | Keeling |
| 2015/0051750 | A1 | 2/2015 | Kurs et al. |
| 2015/0115727 | A1 | 4/2015 | Carobolante et al. |
| 2015/0194837 | A1 | 7/2015 | Tom et al. |
| 2015/0202677 | A1 | 7/2015 | Ogishi et al. |
| 2015/0214775 | A1 | 7/2015 | Lee et al. |
| 2015/0303699 | A1 | 10/2015 | Wagman et al. |
| 2015/0371771 | A1 | 12/2015 | Abu Qahouq |
| 2016/0020639 | A1 | 1/2016 | Pudipeddi et al. |
| 2016/0094043 | A1 | 3/2016 | Hao et al. |
| 2016/0285317 | A1 | 9/2016 | Maniktala |
| 2016/0308394 | A1 | 10/2016 | Abdolkhani et al. |
| 2016/0336817 | A1 | 11/2016 | Jabori et al. |
| 2017/0133876 | A1 | 5/2017 | Knepper |
| 2017/0271927 | A1 | 9/2017 | Sakata et al. |
| 2017/0317536 | A1 | 11/2017 | Marson et al. |
| 2017/0326992 | A1 | 11/2017 | Budhia et al. |
| 2017/0338684 | A1 | 11/2017 | Mishriki et al. |
| 2018/0013310 | A1 | 1/2018 | Moussaoui et al. |
| 2018/0019624 | A1 | 1/2018 | Chen |
| 2018/0034327 | A1 | 2/2018 | Ren et al. |
| 2018/0052649 | A1 | 2/2018 | Patel |
| 2018/0062416 | A1 | 3/2018 | Terry et al. |
| 2018/0062442 | A1 | 3/2018 | Qiu et al. |
| 2018/0064224 | A1 | 3/2018 | Brzezinski et al. |
| 2018/0090954 | A1 | 3/2018 | Graham et al. |
| 2018/0090955 | A1 | 3/2018 | Graham et al. |
| 2018/0090999 | A1 | 3/2018 | Graham et al. |
| 2018/0091000 | A1 | 3/2018 | Jol et al. |
| 2018/0175671 | A1 | 6/2018 | Ren |
| 2018/0257502 | A1 | 9/2018 | Park |
| 2018/0278099 | A1 | 9/2018 | Hong et al. |
| 2018/0301933 | A1 | 10/2018 | Lee et al. |
| 2018/0301936 | A1 | 10/2018 | Lee et al. |
| 2020/0313464 | A1 | 10/2020 | Leabman |
| 2022/0085662 | A1 | 3/2022 | Narayana Bhat et al. |

FOREIGN PATENT DOCUMENTS

| | | |
|---|---|---|
| JP | 2010051137 | 3/2010 |
| JP | 2010226836 | 10/2010 |
| JP | 5288653 | 5/2013 |
| JP | 2014090528 | 5/2014 |
| JP | 2014180078 | 9/2014 |
| JP | 2017169277 | 9/2017 |
| KR | 20130102218 | 9/2013 |
| KR | 20140097362 | 8/2014 |
| WO | 2014035987 | 3/2014 |
| WO | 2014082571 | 6/2014 |
| WO | 2016005984 | 1/2016 |
| WO | 2017120357 | 7/2017 |
| WO | 2017176128 | 10/2017 |
| WO | 2018057656 | 3/2018 |
| WO | 2018111820 | 6/2018 |
| WO | 2018115991 | 6/2018 |
| WO | 2018190985 | 10/2018 |
| WO | 2020142201 | 7/2020 |
| WO | 2021096866 | 5/2021 |

OTHER PUBLICATIONS

Lu, et al., "Wireless Charger Networking for Mobile Devices: Fundamentals, Standards, and Applications", Dec. 9, 2014, 16 pages.
Lu, et al., "Wireless Charging Technologies: Fundamentals, Standards, and Network Applications", IEEE Communications Surveys and Tutorials, to Appear, Nov. 14, 2015, 40 pages.
"Chinese Application No. 201980086969 First Office Action", Feb. 23, 2022, 10 pages.
"Chinese Application No. 201980086969.6 Second Office Action", Jul. 6, 2022, 9 pages.
"India Application No. 201941000168 First Examination Report", Jun. 4, 2021, 6 pages.
"Korean application 10-2021-7024326 Request for Submission of Opinion", Sep. 1, 2023, 8 pages.
"PCT International Application PCT/US2019/066827 International Preliminary Report on Patentability", Jul. 15, 2021, 10 pages.
"PCT International Application PCT/US2019/066827 International Search Report and Written Opinion", Apr. 24, 2020, 13 pages.
"Taiwan Patent Application No. 109100007 Office Action", May 31, 2023, 12 pages.
"U.S. Appl. No. 17/420,101 Non Final Office Action", Oct. 5, 2023, 20 pages.
Chen, "Localization and Free Positioning with a Cooperative Multiple Coil Transmitter for Wireless Power Transfer", From the Faculty of Engineering, Department of Electrical Engineering and Information Technology the University of Duisburg-Essen, Nov. 24, 2017, 243 pages.
Lim, et al., "Positioning-Free Magnetically Resonant Wireless Power Transmission Board with Staggered Repeater Coil Array (SRCA)", 2012 IEEE MTT-S International Microwave Workshop Series on Innovative Wireless Power Transmission: Technologies, Systems, and Applications, May 10-11, 2012, 93-96.
Pu, et al., "A New Definition of Power Transmission Efficiency for Wireless Charging Systems By Using Coil Arrays", 2013 IEEE Antennas and Propagation Society International Symposium (APSURSI), 2013, 1434-1435.
"European Patent Office patent application No. 19842453.3 Communication pursuant to Article 94", Nov. 22, 2023, 12 pages.
"India patent application No. 201911045900 Hearing Notice", Mar. 12, 2024, 3 pages.
"Korea patent application No. 10-2021-7024326 Final Office Action", May 28, 2024, 3 pages.
"U.S. Appl. No. 17/420,101 Final Office Action", May 8, 2024, 24 pages.
Pinto, "Receiving Device for Wireless Charging Equipment of Battery of E.g. Hybrid Car, Has Secondary Coils Arranged so That Recovery Rate of Secondary Coils is Different When Secondary Coils Are Placed Next to Primary Coils of Transmitting Device", Machine translation of FR-2974952-A1 (Year: 2024), 2024, 10 pages.

(56) References Cited

OTHER PUBLICATIONS

Takahashi, et al., "A Cuttable Wireless Power Transfer Sheet", Proc. ACM Interact Mob. Wearable Ubiquitous TechnoL, vol. 2, No. 4, Article 190. Publication date: Dec. 2018., Dec. 2018, 25 pages.
"Japan Patent Application No. 2022-527041 1st Office Action", Sep. 3, 2024, 7 pages.

WIRELESS POWER TRANSFER WITH LOAD SHARING RECEIVERS

CROSS-REFERENCE TO RELATED APPLICATIONS

This application is a National Stage of International Application No. PCT/US2020/059851, filed Nov. 10, 2020, and claims the benefit of priority to India Patent Application No. 201911045900, filed Nov. 12, 2019, the disclosures of which are incorporated herein by reference.

TECHNICAL FIELD

This disclosure relates generally to wireless power, and more specifically, to a wireless power transfer with load sharing receivers.

DESCRIPTION OF THE RELATED TECHNOLOGY

Conventional wireless power systems have been developed with a primary objective of charging a battery in a wireless power receiving apparatus, such as a mobile device, a small electronic device, gadget, or the like. In a conventional wireless power system, a wireless power transmission apparatus may include a primary coil that produces an electromagnetic field. The electromagnetic field may induce a voltage in a secondary coil of a wireless power receiving apparatus when the secondary coil is placed in proximity to the primary coil. In this configuration, the electromagnetic field may transfer power to the secondary coil wirelessly. The power may be transferred using resonant or non-resonant inductive coupling between the primary coil and the secondary coil. The wireless power receiving apparatus may use the received power to operate or may store the received energy in a battery for subsequent use. Traditional techniques for wireless power transfer may not provide sufficient power for newer electronic devices. It is desirable to increase the reliability and amount of power that can be transferred wirelessly.

SUMMARY

The systems, methods, and apparatuses of this disclosure each have several innovative aspects, no single one of which is solely responsible for the desirable attributes disclosed herein.

One innovative aspect of the subject matter described in this disclosure can be implemented in a wireless power receiving apparatus. In some implementations, the wireless power receiving apparatus may include a plurality of wireless power receiver (RX) circuits. Each RX circuit may include a least one secondary coil capable of receiving wireless power from a different primary coil of one or more wireless power transmission apparatuses and provide the wireless power to a power combination circuit. The wireless power receiving apparatus may include the power combination circuit electrically coupled to the plurality of RX circuits and configured to combine the wireless power from at least two RX circuits and to provide the combined wireless power to at least a first load.

In some implementations, the wireless power receiving apparatus may include one or more RX controllers connected to the plurality of RX circuits. Each of the one or more RX controllers may be configured to operate in accordance with at least one droop configuration. The droop configuration may represent a relationship between a voltage level and an amount of current provided by an RX circuit to the power combination circuit.

In some implementations, a single RX controller controls multiple RX circuits. The single RX controller may be configured to different droop characteristics for each of the multiple RX circuits based on an alignment metric for each RX circuit.

In some implementations, the one or more RX controllers include at least a first RX controller for controlling a first RX circuit of the plurality of RX circuits, the first RX controller configured with a first droop configuration.

In some implementations, the first RX controller is configured to determine a measured voltage and a measured current of the wireless power provided by the first RX circuit to the power combination circuit. The first RX controller may be configured to determine an expected current based on measured voltage and the first droop configuration. The first droop configuration may indicate different expected current levels based on different measured voltages. The first RX controller may determine a current error value based on a difference between the expected current with the measured current. The first RX controller may cause the first RX circuit to communicate a feedback communication to a wireless power transmission apparatus based on the current error value. The feedback communication may be configured to cause the wireless power transmission apparatus to update an operating point of the wireless power transmitted by a first primary coil of the wireless power transmission apparatus to a first secondary coil the first RX circuit.

In some implementations, the first RX controller is configured to receive a transmitter communication from the wireless power transmission apparatus. The first RX controller may determine an alignment metric that indicates how well the first RX circuit is aligned with the first primary coil of the wireless power transmission apparatus. The first RX controller may select between the first droop configuration and a second droop configuration based on the alignment metric.

In some implementations, each of the plurality of RX circuits is capable of receiving a low power wireless signal in accordance with a wireless charging standard. The power combination circuit may be configured to provide the combined wireless power as a high-power signal to the first load.

In some implementations, each low power wireless signal is not over 15 Watts, and the high-power signal is over 15 Watts.

In some implementations, each of the plurality of RX circuits is configured to contribute same amounts of wireless power to the power combination circuit.

In some implementations, the plurality of RX circuits includes a first RX circuit and a second RX circuit. The first RX circuit and the second RX circuit may contribute different amounts of wireless power to the power combination circuit.

In some implementations, the different amounts of wireless power are based, at least in part, on differences between a first alignment of a first secondary coil of the first RX circuit with a first primary coil and a second alignment of a second secondary coil of the second RX circuit with a second primary coil.

In some implementations, the plurality of RX circuits is connected in parallel with each other to the power combination circuit.

In some implementations, the plurality of RX circuits is connected in series such that a first RX circuit and a last RX circuit are connected to the power combination circuit.

In some implementations, a first set of RX circuits are connected in series with each other, and a second set of RX circuits are connected in series, and the first set of RX circuits and the second set of RX circuits are connected in parallel to the power combination circuit.

In some implementations, the wireless power receiving apparatus may include a set of switches that are configured to add or remove selected ones of the plurality of RX circuits to a parallel or series circuit before connecting the selected ones of the plurality of RX circuits to the power combination circuit.

In some implementations, the wireless power receiving apparatus may include at least one power output configured to provide the combined wireless power to the first load, wherein the first load is external to the wireless power receiving apparatus.

In some implementations, the wireless power receiving apparatus may include a plurality of power outputs including at least a first power output port and a second power output port.

In some implementations, each of the plurality of power outputs are associated with different output power ratings.

In some implementations, the wireless power receiving apparatus may include a housing for the plurality of RX circuits. The housing may be configured to attach to the electronic device.

In some implementations, the load includes a battery charger of the electronic device.

In some implementations, the wireless power receiving apparatus may include at least one supervisory controller configured to manage one or more RX circuits. The supervisory controller may be configured to determine when to enable or disable one or more of the RX circuits based on a power consumption of the load.

In some implementations, the supervisory controller is further configured to determine when to enable or disable one or more of the RX circuits based on an estimation of alignment between each RX circuit and a corresponding TX circuit.

In some implementations, the wireless power receiving apparatus may include at least one power input connection configured to receive power from an external RX circuit and provide the power to the power combination circuit.

In some implementations, the power combination circuit is configured to provide a first power signal to the first load via a first power output and a second power signal to a second load via a second power output.

Another innovative aspect of the subject matter described in this disclosure can be implemented in a method performed by a wireless power receiving apparatus. In some implementations, the method may include receiving, by a plurality for RX circuits, wireless power from one or more wireless power transmission apparatus. Each RX circuit may include a least one secondary coil to receive the wireless power from a different primary coil of one or more wireless power transmission apparatuses and provide the wireless power to a power combination circuit. The method may include combining, by the power combination circuit, the wireless power received by the plurality of RX circuits to form a combined power signal. The method may include providing the combined power signal to at least a first load.

In some implementations the method may include determining to deactivate a first RX circuit based, at least in part, on a misalignment of a first secondary coil in the first RX circuit with a first primary coil of a wireless power transmission apparatus.

In some implementations, the method may include deactivating one or more of the plurality of RX circuits based on a determination that the first load is using less power than the combined power signal.

In some implementations, the method may include activating one or more of the plurality of RX circuits based on a determination to reduce an amount of wireless power contributed by each of the plurality of RX circuits.

In some implementations, the method may include providing a first power signal from the power combination circuit to the first load via a first power output. In some implementations, the method may include providing a second power signal from the power combination circuit to a second load via a second power output.

In some implementations, the method may include determining a measured voltage and a measured current of the wireless power provided by a first RX circuit to the power combination circuit. The method may include determining an expected current based on measured voltage and a first droop configuration, wherein the first droop configuration indicates different expected current levels based on different measured voltages. The method may include determining a current error value based on a difference between the expected current with the measured current. In some implementations, the method may include causing the first RX circuit to communicate a feedback communication to a wireless power transmission apparatus based on the current error value. The feedback communication may be configured to cause the wireless power transmission apparatus to update an operating point of the wireless power transmitted by a first primary coil of the wireless power transmission apparatus to a first secondary coil the first RX circuit.

In some implementations, the method may include receiving a transmitter communication from a wireless power transmission apparatus. The method may include determining an alignment metric that indicates how well the first RX circuit is aligned with the first primary coil of the wireless power transmission apparatus. In some implementations, the method may include selecting between the first droop configuration and a second droop configuration based on the alignment metric.

BRIEF DESCRIPTION OF THE DRAWINGS

Details of one or more implementations of the subject matter described in this disclosure are set forth in the accompanying drawings and the description below. Other features, aspects, and advantages will become apparent from the description, the drawings and the claims. Note that the relative dimensions of the following figures may not be drawn to scale.

Like reference numbers and designations in the various drawings indicate like elements.

DETAILED DESCRIPTION

Figure 1:
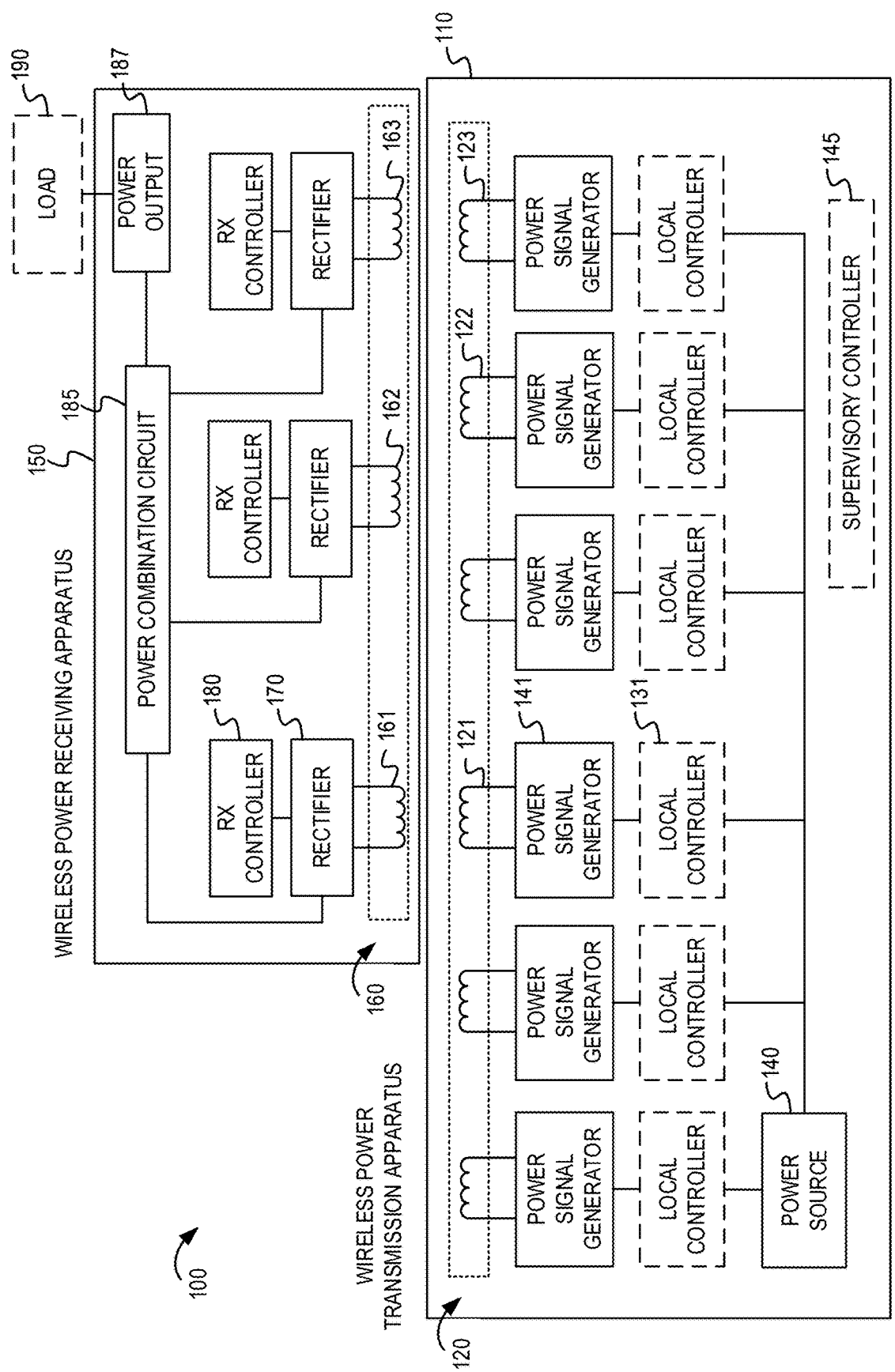
FIG. 1 shows an overview of components associated with an example wireless power system according to some implementations.

The following description is directed to certain implementations for the purposes of describing innovative aspects of this disclosure. However, a person having ordinary skill in the art will readily recognize that the teachings herein can be applied in a multitude of different ways. The described implementations can be implemented in any means, apparatus, system, or method for transmitting or receiving wireless power.

A traditional wireless power system may include a wireless power transmission apparatus and a wireless power receiving apparatus. The wireless power transmission apparatus may include a primary coil that transmits wireless energy (as a wireless power signal) to a corresponding secondary coil in the wireless power receiving apparatus. A primary coil refers to a source of wireless energy (such as inductive or magnetic resonant energy) in a wireless power transmission apparatus. A secondary coil is located in a wireless power receiving apparatus and receives the wireless energy. In some traditional wireless power systems, a primary coil can transfer wireless energy to a secondary coil up to an amount predetermined by a wireless standard. For example, a low power wireless power signal may convey 5 Watts (W), 9 W, 12 W, or 15 W. Therefore, a low power wireless power system may deliver up to 15 Watts of energy which is suitable for many electronic devices.

Higher power wireless systems are being developed to support wireless power transmission to electronic devices that require more power (greater than 15 W). For example, a laptop computer, monitor, appliance, or other electronic device may use 65 W, 90 W or 120 W. A concern with higher power wireless systems is the amount of electromagnetic interference (EMI) that high power wireless systems may cause. Undesirable EMI may be caused by excess magnetic flux that is not linked to the secondary coil. Furthermore, using a larger primary coil and larger secondary coil may support higher power transfer but results in more sensitivity to a failure or misalignment.

Power transfer capability may be related to how closely the primary coil and secondary coil are positioned or aligned to each other. Wireless power transmission is more efficient when the primary and secondary coils are closely positioned. Conversely, the efficiency may decrease (or the power transfer may cease) when the primary and secondary coils are misaligned. In this disclosure, alignment may refer to a spatial relationship between a secondary coil of the wireless power receiving apparatus and a primary coil of the wireless power transmission apparatus. A misalignment may reduce efficiency of the wireless power transfer or may cause an increase in wireless power signal from a primary coil to adjust for the misalignment. For example, a primary coil may output a higher amount of magnetic flux in order to meet the demand of a load associated with a misaligned secondary coil.

Various implementations relate generally to the use of multiple secondary coils to concurrently receive wireless power from different primary coils. A wireless power receiving apparatus may combine the wireless power to produce a combined wireless power. A power output can deliver the combined wireless power to a load (such as a battery or other power input of an electronic device). Some implementations more specifically relate to a wireless power receiving apparatus that utilizes independent receive (RX) controllers that control different secondary coils. The RX controllers may manage the amount of power that the secondary coil contributes to the combined wireless power. In some implementations, the RX controllers may include droop configurations that determine an amount of current or voltage contributed by each secondary coil. The droop configurations may be implemented using a droop controller or may be implemented as software in the RX controller. The droop configuration may control an amount of voltage delivered from each secondary coil to the power combination circuit based on a current load. In some implementations, a droop configuration may account for alignment and power transfer efficiency between the primary coil and the secondary coil. The droop configurations of each RX controller may be based on a power rating for each secondary coil.

In accordance with this disclosure, a wireless power system may utilize multiple primary coils and secondary coils to transfer wireless power from a wireless power transmission apparatus to a wireless power receiving apparatus. For example, each primary coil may transmit a low power signal (15 W or less) to a corresponding secondary coil. The wireless power receiving apparatus may combine wireless power from multiple secondary coils to provide a high-power wireless power to a load. For example, a wireless power receiving apparatus may combine 15 W from each of six secondary coils to provide a 90 W power signal to an electronic device. The activation of primary coils and number of secondary coils involved in power transfer may be based on alignment of the primary coils and secondary coils or the load demand, or both.

In some implementations, the wireless power transmission apparatus and the wireless power receiving apparatus may be manufactured according to a standardized wireless power specification, such as the Qi® specification provided by the Wireless Power Consortium. For example, the wireless power transmission apparatus may include multiple primary coils, where each primary coil may conform to the Qi specification. The wireless power receiving apparatus may include multiple secondary coils, where each secondary coil may conform to the Qi specification. While the Qi specification does not describe a wireless power receiving apparatus having multiple secondary coils, some implementations of this disclosure utilize multiple secondary coils to combine wireless power received from multiple Qi-compatible primary coils.

In some implementations, a charging surface of the wireless power transmission apparatus may have an array of primary coils in an overlapping arrangement. In some implementations, the primary coils may be configured in a non-overlapping arrangement. The arrangement of primary coils (overlapping or non-overlapping) may minimize, reduce, or eliminate dead zones. The design may distribute the areas of magnetic flux that is available to transfer power to a wireless power receiving apparatus on the charging surface. In some implementations, the wireless power transmission apparatus may be referred to as a zoneless charging pad. Depending on an orientation and position of the wireless power receiving apparatus on the charging surface, different primary coils may be activated to provide power to corresponding secondary coils of the wireless power receiving apparatus.

In some implementations, the wireless power receiving apparatus may have an array of secondary coils. In some implementations, more than one secondary coil of the wireless power receiving apparatus may be activated by a corresponding primary coil of one or more wireless power transmission apparatuses. Depending on an alignment (or wireless power transfer efficiency) or the load requirements, different ones of the secondary coils may be activated or deactivated so that those secondary coils that remain activated have a high efficiency and good alignment. In some implementations, the wireless power receiving apparatus may use load sharing so that the amount of wireless power drawn by each activated secondary coil can be reduced.

In some implementations, a wireless power receiving apparatus may have more than one power output. For example, the wireless power receiving apparatus may be a sleeve, pad, device, or other construction that may have multiple power output ports for charging multiple loads. The wireless power receiving apparatus may be capable of combining wireless power received by multiple secondary coils and provide power to different loads. In some implementations, the wireless power receiving apparatus may provide power output ports for connecting to external loads (such as other electronic devices).

Particular implementations of the subject matter described in this disclosure can be implemented to realize one or more of the following potential advantages. In some implementations, the described techniques can be used to combine wireless power received from multiple secondary coils to generate a high-power output to a load. The wireless power system may cause less EMI and provide better efficiency of wireless power transfer compared to conventional wireless power systems that use only one wireless power signal. The electronics in both the wireless power transmission apparatus and wireless power receiving apparatus can utilize a modular design with components having a smaller power rating. The use of multiple primary coils or secondary coils (or both) may reduce an amount of wireless power transmitted by a primary coil that is only partially aligned with a secondary coil. Advantageously, implementations of this disclosure can support higher power for appliances and electronic devices that require greater amounts of power. Cost and complexity of the wireless power system may be reduced by using multiple low power wireless power signals to accommodate a greater wireless power transfer.

FIG. 1 shows an overview of components associated with an example wireless power system according to some implementations. The wireless power system 100 includes a wireless power transmission apparatus 110 which has multiple primary coils 120. Each of the primary coils 120 may be associated with a power signal generator. For example, a first primary coil 121 may be associated with power signal generator 141. Each primary coil may be a wire coil which transmits a wireless power signal (which also may be referred to as wireless energy). The primary coil may transmit wireless energy using inductive or magnetic resonant field. The power signal generator may include components (not shown) to prepare the wireless power signal. For example, the power signal generator may include one or more switches, drivers, a series capacitor, or other components. The wireless power transmission apparatus 110 may include a power source 140 which is configured to provide power to each of the transmitter circuits in the wireless power transmission apparatus 110. The power source 140 may convert alternating current (AC) to direct current (DC). In some implementations, the primary coils 120 may have separate TX circuits for each primary coil such that each primary coil can be energized independently.

The primary coils 120 may be managed by one or more controllers (such as communication and current/power controllers) that control whether the primary coil is transmitting wireless power. The primary coils 120 may be controlled by a single controller (such as a master controller). In some implementations, each primary coil may be associated with a different local controller, driver, voltage regulator, and the like. In some implementations, each primary coil may be coupled with separate circuit components like a capacitor (in series with the primary coil), a current sensing resistor, or other elements. Each local controller may determine whether to cause its associated primary coil to transmit wireless power. For example, the local controller may periodically activate one more switches associated with the primary coil (and series capacitor) to excite (or briefly energize) the primary coil. The local controller may perform a coil current sensing process to determine if a wireless power receiving apparatus is located near the primary coil. If a wireless power receiving apparatus is detected, the local controller may activate one or more switches associated with the primary coil to cause the primary coil to transmit wireless power. In some implementations, a local controller may independently manage more than one primary coil. The local controller that receives a communication from the wireless power receiving apparatus in response to a ping action may determine that the wireless power receiving apparatus is latched to its primary coil. The local controller may cause its primary coil to provide wireless energy to the secondary coil of the wireless power receiving apparatus.

The local controllers that are associated with nearby primary coils may continue to ping for the presence of a second wireless power receiving apparatus. In some implementations, a supervisory controller 145 may coordinate with multiple local controllers.

The controller (such as a master controller or each local controller) may be configured to detect the presence or proximity of a wireless power receiving apparatus. For example, the controller (master controller or each local controller) may cause their associated primary coils to periodically transmit a detection signal and measure for a change in coil current or load that indicates an object near the primary coil. In some implementations, the local controller may detect a ping, wireless communication, load modulation, or the like, to determine that a secondary coil of a wireless power receiving apparatus is near the primary coil.

FIG. 1 also shows a wireless power receiving apparatus 150. A wireless power receiving apparatus may be any type of device capable of receiving wireless power, including a mobile phone, computer, laptop, peripheral, gadget, robot, vehicle, or the like. The wireless power receiving apparatus 150 may have an array of secondary coils 160, including a first secondary coil 161, a second secondary coil 162 and a third secondary coil 163. The secondary coils 160 may each be capable of receiving wireless power from a different primary coil. For example, when the first secondary coil 161 is positioned near the first primary coil 121, the first local controller 131 may detect its presence. For example, during a detection phase, the first primary coil 121 may transmit a detection signal (which also may be referred to as a ping). The coil current at the first primary coil 121 may be measured to determine whether the coil current has crossed a threshold indicating an object in the electromagnetic field of the first primary coil 121. If an object is detected, the first local controller 131 may wait for a handshake signal from the wireless power receiving apparatus 150 (such as an identification signal or setup signal) to determine whether the object is a wireless power receiving apparatus or a foreign object. The handshake signal may be communicated by the wireless power receiving apparatus 150 using a series of load changes (such as load modulations). The load changes may be detectable by a sensing circuit and interpreted by the first primary coil 121. The first primary coil 121 may interpret the variations in the load to recover the communication from the wireless power receiving apparatus 150. The communication may include information such as charging level, requested voltage, received power, receiver power capability, support for a wireless charging standard, or the like.

In the wireless power receiving apparatus 150, each of the secondary coils 160 may be part of separate receive (RX) circuits. For example, each RX circuit may include one or more secondary coils, a rectifier 170, and a receive (RX) controller 180. Each secondary coil 160 that is properly aligned may generate an induced voltage based on the received wireless power signal from one of the primary coils 120. A capacitor (not shown) may be in series between the secondary coil and the rectifier. The rectifier may rectify the induced voltage and provide the induced voltage to a power combination circuit 185 that combines power from multiple secondary coils. The power combination circuit 185 may provide a combined wireless power to a load 190, such as a battery module (not shown). The load 190 may be in the wireless power receiving apparatus 150 or may be an external device that is coupled by an electrical interface, such as a power output 187 of the wireless power receiving apparatus 150. The load 190 may include a charger stage, protection circuits such as a temperature-detecting circuit, and overvoltage and overcurrent protection circuits.

Depending on the position of the wireless power receiving apparatus 150 in relation to the primary coils 120, some secondary coils may be aligned with a primary coil, while some other secondary coils may not be aligned with a primary coil. For example, in FIG. 1, the first secondary coil 161 may be aligned with a first primary coil 121 and a third secondary coil 163 may be aligned with a third primary coil 123. However, the second secondary coil 162 may not be aligned with a primary coil or may have a poor alignment (such as with the second primary coil 122). Each RX controller (or a supervisory controller of the wireless power receiving apparatus 150, not shown) may determine whether to receive power from particular secondary coils. For example, the determination that a secondary coil is well aligned may be based on an efficiency metric or communication with a corresponding primary coil. In the example of FIG. 1, the second secondary coil 162 may be deactivated because it does not have a good magnetic coupling with the second primary coil 122. Similarly, the 110 may determine which primary coils to transmit wireless power. A controller (such as a master controller or each of the local controllers) of the wireless power transmission apparatus 110 may activate the first primary coil 121 and the third primary coil 123 to provide wireless power to the wireless power transmission apparatus 110. The controller may deactivate the second primary coil 122 due to poor alignment or low efficiency of wireless power transfer.

Figure 2:
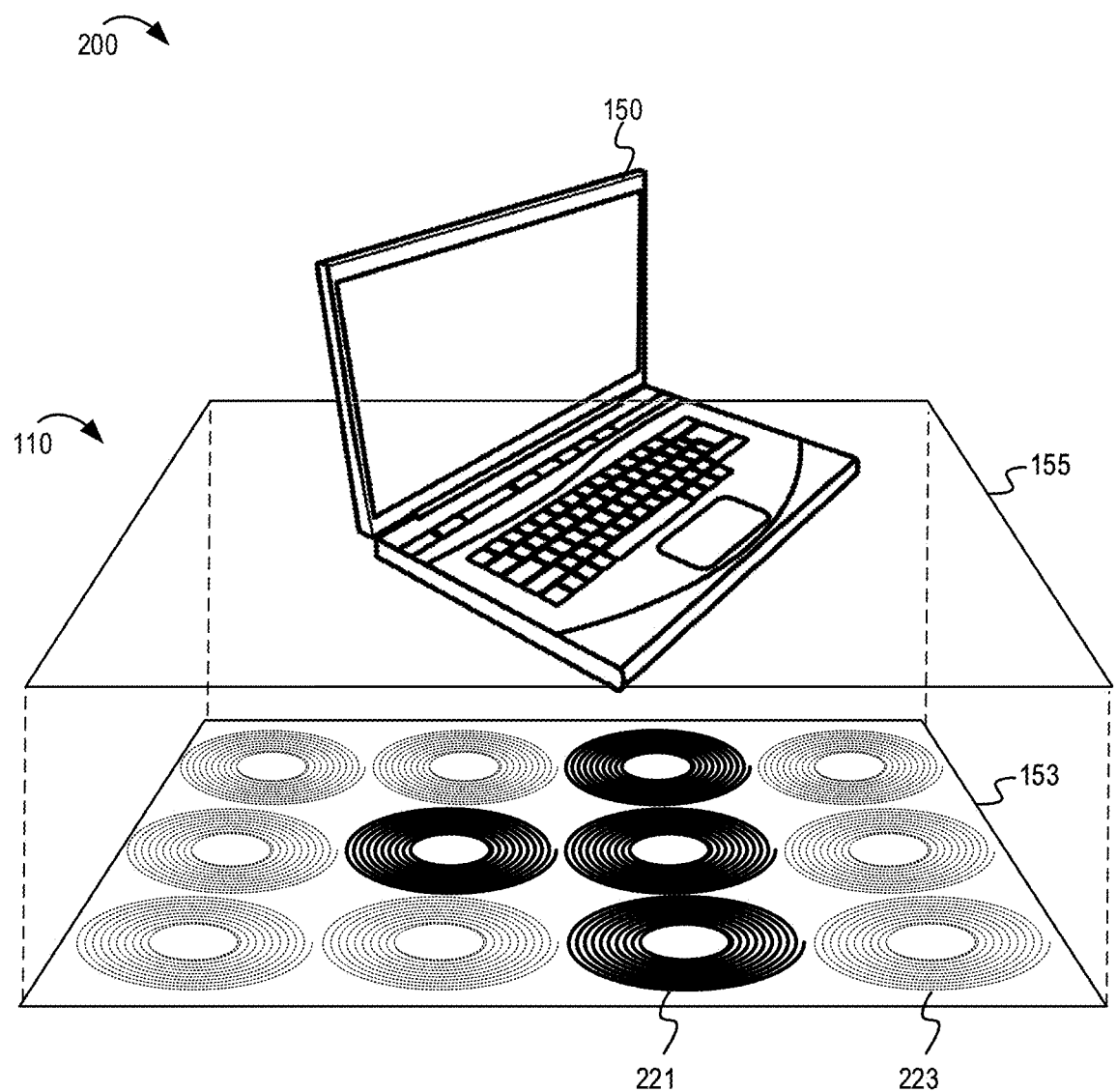
FIG. 2 shows an example wireless power system that includes a wireless power receiving apparatus capable of receiving power from multiple primary coils of a wireless power transmission apparatus according to some implementations.

FIG. 2 shows an example wireless power system 200 that includes a wireless power receiving apparatus 150 capable of receiving power from multiple primary coils of a wireless power transmission apparatus 110 according to some implementations. The example wireless power transmission apparatus 110 includes 12 primary coils (shown in portion 153). However, the quantity and arrangement of primary coils are provided as an example. Other quantities of primary coils, number of layers, or arrangements may be possible. A charging surface 155 may house the primary coils. The wireless power receiving apparatus 150 may be placed on the charging surface 155. Although shown as a laptop, the wireless power receiving apparatus 150 may be any type of electronic device. Furthermore, the wireless power receiving apparatus 150 may be a component integrated into the electronic device or may be an external component or attachment that couples to the electronic device. In FIG. 2, the wireless power receiving apparatus 150 is positioned on the charging surface 155 such that a first set of primary coils 221 are activated to transmit wireless power while other primary coils (such as primary coil 223) are deactivated. The deactivated primary coils may periodically activate for ping or detection to detect for presence of a secondary coil (either due to movement of the wireless power receiving apparatus 150 or from another wireless power receiving apparatus, not shown). Inside the wireless power receiving apparatus 150 (such as inside a bottom surface portion of the laptop), there are a plurality of secondary coils (not shown) that are latched to the activated primary coils 221.

Figure 3:
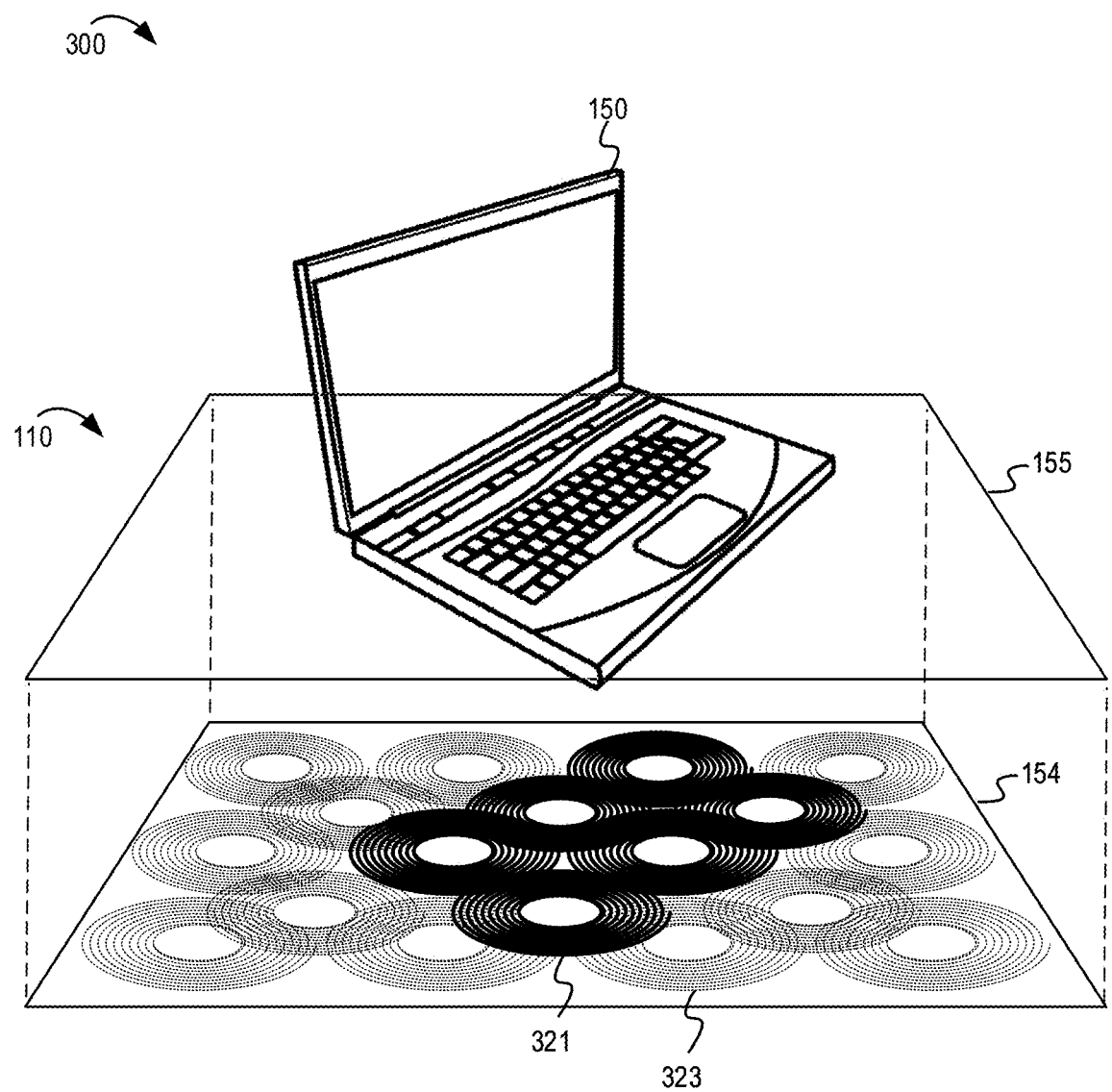
FIG. 3 shows an example wireless power system in which a wireless power transmission apparatus includes multiple layers of primary coils arranged in an overlapping pattern according to some implementations.

FIG. 3 shows an example wireless power system 300 in which a wireless power transmission apparatus 110 includes multiple layers of primary coils arranged in an overlapping pattern according to some implementations. The example wireless power transmission apparatus 110 includes 18 primary coils arranged in overlapping layers (shown in portion 154). The quantity and arrangement of primary coils are provided as an example. Other quantities of primary coils, number of layers, or arrangements may be possible. The wireless power receiving apparatus 150 may be placed on a charging surface 155 of the wireless power transmission apparatus 110. A first set of primary coils 321 may be activated to transmit wireless power to corresponding secondary coils (not shown) in the wireless power receiving apparatus 150. Other primary coils 323 may be deactivated. Although FIG. 3 shows that some of the activated coils are overlapping, in some implementations, the wireless power transmission apparatus 110 may refrain from activating overlapping coils.

In implementations when the wireless power transmission apparatus 110 or the wireless power receiving apparatus 150 (or both) implement overlapping coils, the pattern of overlapping coils may reduce an amount of area where a wireless power signal is exposed (or not aligned with a secondary coil). This may have the result of reducing EMI. Furthermore, by activating multiple primary coils 321, the amount of power contributed by each activated primary coil 321 may be lowered. Lower power transmission for each primary coil may reduce the amount of EMI and other interference to other components of the wireless power receiving apparatus 150 (or the electronic device which it powers).

Figure 4:
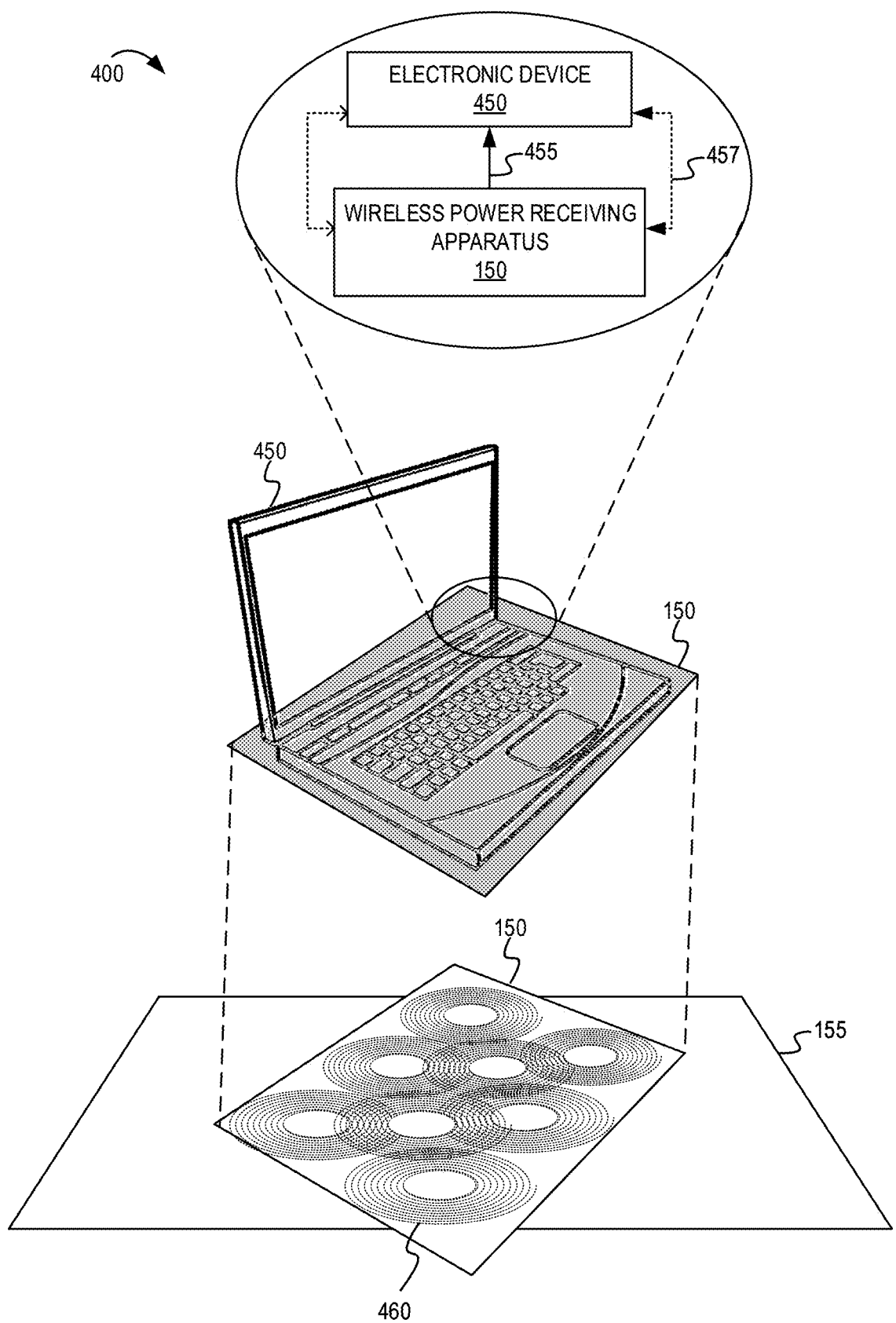
FIG. 4 shows an example wireless power system in which a wireless power receiving apparatus is configured to provide power to an electronic device according to some implementations.

FIG. 4 shows an example wireless power system 400 in which a wireless power receiving apparatus 150 is configured to provide power to an electronic device 450 according to some implementations. In FIG. 4, the wireless power receiving apparatus 150 may be a wireless power pad that has multiple secondary coils 460. In the example of FIG. 4, the secondary coils are arranged in an overlapping pattern. The wireless power receiving apparatus 150 may have an electrical interface 455 or other connection that provides power from the wireless power receiving apparatus 150 to the electronic device 450. In some implementations, a fastener 457 (such as a clip, magnet, button, casing, or the like) may be used to physical couple the wireless power receiving apparatus 150 to the electronic device 450. The fastener 457 may be part of the wireless power receiving apparatus 150, the electronic device 450, or both. For example, the wireless power receiving apparatus 150 include a housing that contains the secondary coils, and the housing may attach to a laptop or tablet.

Figure 5:
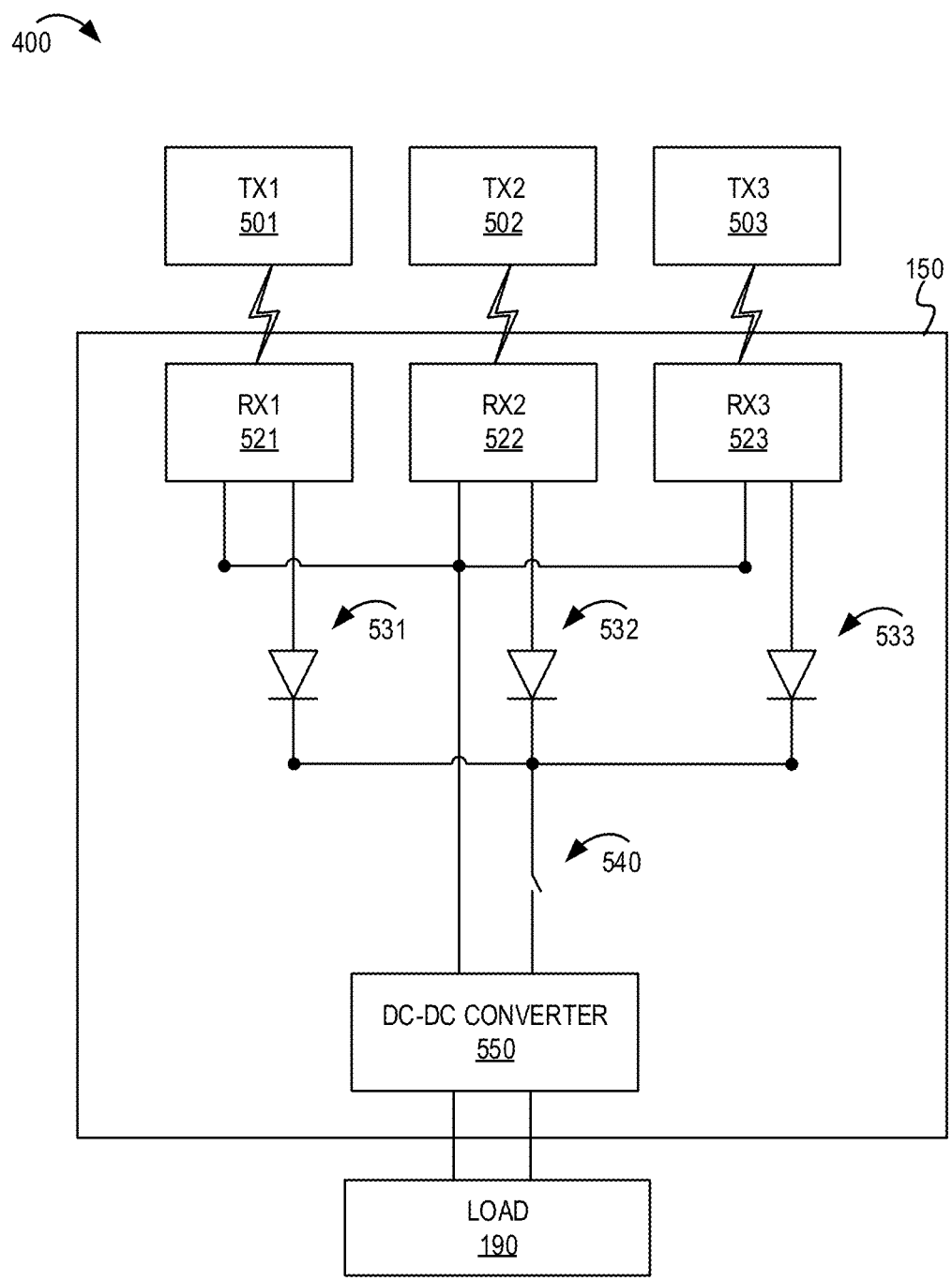
FIG. 5 shows a block diagram of an example wireless power system that combines power from multiple secondary coils according to some implementations.

FIG. 5 shows a block diagram of an example wireless power system 400 that combines power from multiple secondary coils according to some implementations. A wireless power receiving apparatus 150 may include multiple wireless power receiver (RX) circuits (such as RX circuits 521, 522, and 523). Although only three RX circuits are shown in FIG. 5, other implementations may include more TX circuits or fewer RX circuits. Each RX circuit may have a secondary coil, a rectifier, and an RX controller, similar to the first secondary coil 161, the rectifier 170, and the RX controller 180 as described with reference to FIG. 1). For brevity, the secondary coils, the rectifiers, and the RX controllers are not shown in FIG. 5. Each of the RX circuits 521, 522, and 523 may be capable of receiving wireless power from different wireless power transmitter (TX) circuits (such as TX circuits 501, 502, and 503). Each TX circuit may have a primary coil, a power signal generator, and a local controller, similar to the first primary coil 121, the power signal generator 141, and the first local controller 131 as described with reference to FIG. 1). For brevity, the primary coils, the power signal generators, and the local controllers are not shown in FIG. 5. The RX controllers of the RX circuits 521, 522, and 523 include communication and control units that can independently control an amount of wireless power received by each RX circuit. Note that, in this implementation, no supervisory controller is required. As described further in this disclosure, each RX controller of the RX circuits 521, 522, and 523 may have a droop configuration that manages the amount of current supplied by each RX circuit 521, 522, and 523. of the Each of the RX circuits 521, 522, and 523 may be protected by corresponding diodes 531, 532, and 533 (or other protective circuits).

The RX circuits 521, 522, and 523 may be connected in parallel to aggregate the wireless power received by each of them. In some implementation, the use of aggregated wireless power may support higher power rating while mitigating disadvantages that may be associated with using a single secondary coil to deliver higher amounts of wireless power.

The wireless power receiving apparatus 150 may have a load switch 540 and a DC-to-DC converter 550. The load switch 540 which may be opened to disconnect the DC-to-DC converter 550 from the RX circuits 521, 522, and 523, or may be closed to connect the DC-to-DC converter 550 to the RX circuits 521, 522, and 523. The load switch 540 may be initially open until output voltages from one or more of the RX circuits are established. When the load switch 540 is closed, the current can flow to the DC-to-DC converter 550 which produces an output voltage to the load 190.

Using the general architecture described in FIG. 5, an example scenario may describe the operation of the wireless power receiving apparatus 150. In the example scenario, the load 190 may utilize a 5 Volt power output with a 3 Amp power rating. Each of the RX circuits 521, 522, and 523 may be programmed with droop configurations that accommodate the combined power output and power rating. For example, each of the RX circuits 521, 522, and 523 may have droop configurations that vary the voltage output of each RX circuit to output (to the DC-to-DC converter 550) between 8 Volts and 9 Volts linearly when the loading is between 0 and 0.67 Amps. For example, when the output voltage is 8 Volts, the output current is 0.67 Amps. When the output voltage is 9 Volts, the output current is 0 Amps. This droop configurations are further described with reference to FIG. 6.

Continuing with FIG. 5, each RX circuit can output a max current of 0.67 Amps at 8 Volts, which is equivalent to 5.36 Watts (8 Volts×0.67 Amps). Thus, when combining power from all three of the RX circuits 521, 522, and 523, the wireless power receiving apparatus 150 can output a total over 15 Watts (3×5.36 Watts=16.08 Watts). As described above, the example load 190 in this scenario requires 15 Watts (5 Volts×3 Amps=15 Watts).

The droop configuration that is programmed in the RX controllers for the RX circuits 521, 522, and 523 may control how much current is provided by each RX circuit. When the RX circuits 521, 522, and 523 are initially placed on the TX circuits 501, 502, and 503, all of the RX circuits 521, 522, and 523 may attempt to maximize wireless power transfers. They, they may produce a 9 Volt output voltage. But the droop configuration will indicate no load (0 Amps). Thus, the RX circuit may communicate a voltage error to its respective TX circuit to take appropriate control action to control the RX output voltage.

The RX circuit (such as RX circuit 521) which has the highest output voltage (from among the three RX circuits 521, 522, and 523) may begin contributing the load current. As a consequence of producing more load current, the output voltage of that RX circuit will fall below the output voltages of the other RX circuits. Then, the other RX circuits will have a higher voltage and will start load current contribution. For each control cycle of the RX controller, depending on the voltage produced by its respective RX circuit, the reference current will be calculated from the linear droop configuration. The RX controller can determine whether the measured output current is above or below the calculated reference current. The current error (Ierror=Imeasured−Icalculated) is communicated to the TX circuit to take appropriate control action to correct the amount of power produced by each RX circuit to the DC-to-DC converter 550. Eventually, the RX circuits 521, 522, and 523 may establish similar operating points between themselves.

If each of the RX circuits 521, 522, and 523 have the same degree of alignment with their respective RX circuits 501, 502, and 503, and if each of the RX circuits 521, 522, and 523 are configured with the same droop configurations, they will achieve roughly equal load sharing among the parallel connected RX circuits 521, 522, and 523. It is noted that in some implementations, the droop configuration may be altered based on the power rating of each RX circuit (if different power ratings) or based on alignment of the RX circuit to its respective TX circuit.

In some implementations, the voltage control may be done at when there is no loading to avoid any RX controller malfunctioning due to ADC offset error at zero current. The load switch 540 may protect the DC-to-DC converter 550 as well as protect the RX circuits 521, 522, and 523. For example, if the load current on a particular RX circuit 521, 522, or 523 exceeds the designed value. This scenario may occur, for example, when one of the RX circuits 521, 522, or 523 snaps off or unlatches but the load 190 remains the same. To compensate for the unlatching of the first RX circuit, the output voltage of the other RX circuits may droop to provide more output current. However, the load switch 540 can be opened to disconnect the load to avoid overloading of those RX circuits.

Figure 6:
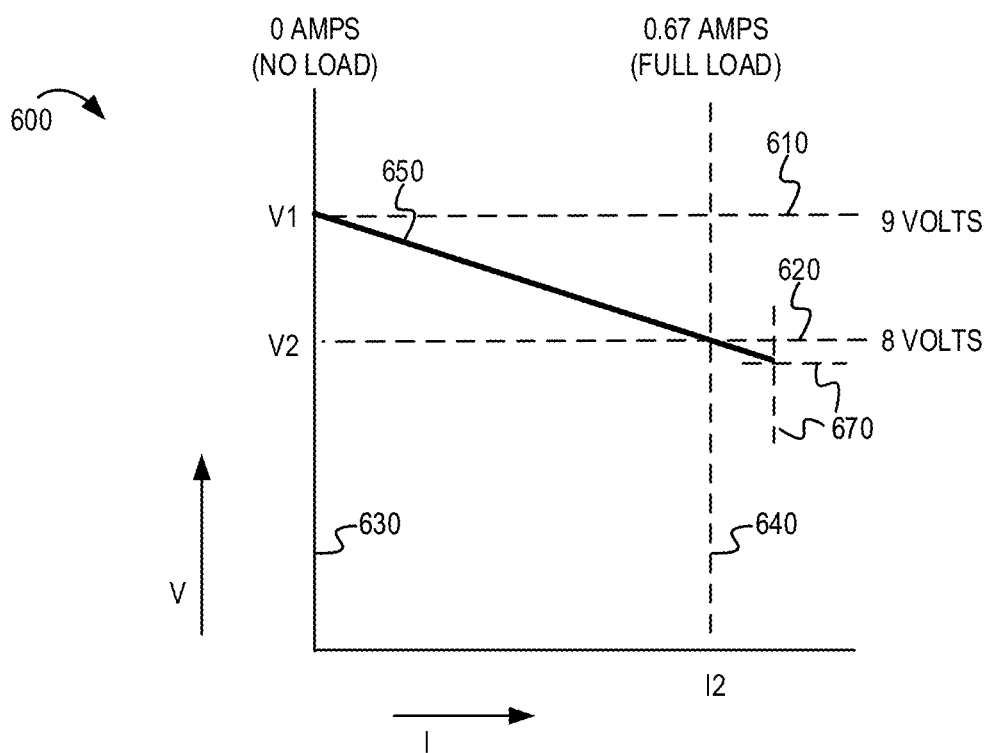
FIG. 6 shows a graph of an example droop configuration according to some implementations.

FIG. 6 shows a graph of an example droop configuration 600 according to some implementations. The example droop configuration 600 shown in FIG. 6 is based on the example scenario described in FIG. 5. As described in FIG. 6, each RX controller may control the output of their respective RX circuit based on a linear droop configuration. It is noted that the droop configuration may be non-linear in some other implementations.

The example droop configuration 600 shown in FIG. 6 shows a range from 9 Volts 610 (which should output 0 Amps 630 or no load) to 8 Volts 620 (which should output 0.67 Amps 640 at full load). By measuring the output voltage of the RX circuit, the RX controller can calculate the reference current value from the droop configuration. If the measured output current is different from the calculated reference current value, the RX controller can communicate a message to the TX circuit to adjust the amount of wireless power between the TX circuit and the RX circuit. If the voltage drops (or current increases) beyond a threshold 670, the RX controller may disable or disconnect the RX circuit to prevent damage to the RX circuit. As shown in FIG. 6, the threshold 670 may be based on under-voltage or over-current, or both.

Figure 7:
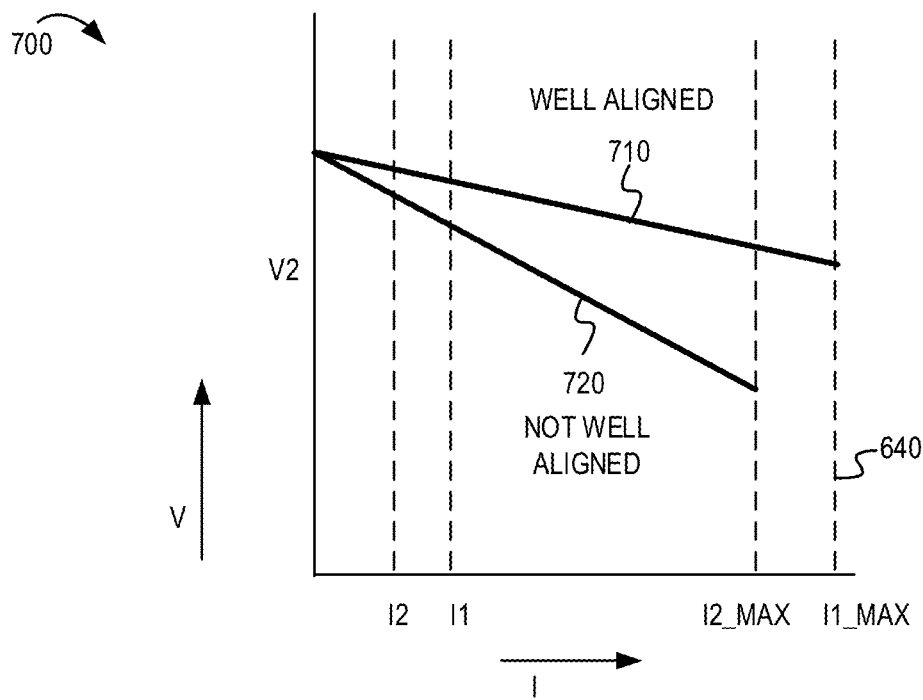
FIG. 7 shows a graph of an example dynamic droop configuration according to some implementations.

FIG. 7 shows a graph of an example dynamic droop configuration 700 according to some implementations. When the RX circuit is positioned near a TX circuit, the RX controller may use load modulation to communicate a signal strength packet to the local controller of the TX circuit. The signal strength packet can be used as a measure of the alignment between the TX circuit and the RX circuit. The local controller of the TX circuit may adjust transmit power to correct for misalignment. However, in some misalignment scenarios, the TX circuit may be unable to adjust the transmit power sufficiently to correct for the received voltage or current error. For example, the TX circuit may reach a limit on an amount of wireless transmit power. In such a misalignment scenario, the RX controller may utilize a different droop configuration for that RX circuit to reduce the load contribution provided by that RX circuit based on the load voltage. Therefore, the RX controller may use a first droop configuration 710 when the RX controller determines that the RX circuit is well aligned with the TX circuit. The RX controller may use a second droop configuration 720 when the RX controller determines that the RX circuit is not well aligned with the TX circuit. The first droop configuration 710 may support a higher output current that ranges from $I_{1\_max}$ to $I_1$, while the second droop configuration 720 may support a lower output current that ranges from $I_{2\_max}$ to $I_2$. In some implementations, the signal strength indicated in the signal strength packet may be compared with a threshold to determine which droop configuration to use.

For the same output voltage, a well aligned TX-RX pair (RX circuit drawing wireless power from a TX circuit) will contribute more power to the load than a not-so-well aligned TX-RX pair. This approach may reduce the current in the primary coils that are providing power to the non-so-well aligned RX circuit. Thus, the overall operating efficiency of the wireless power receiving apparatus may be improved.

Figure 8:
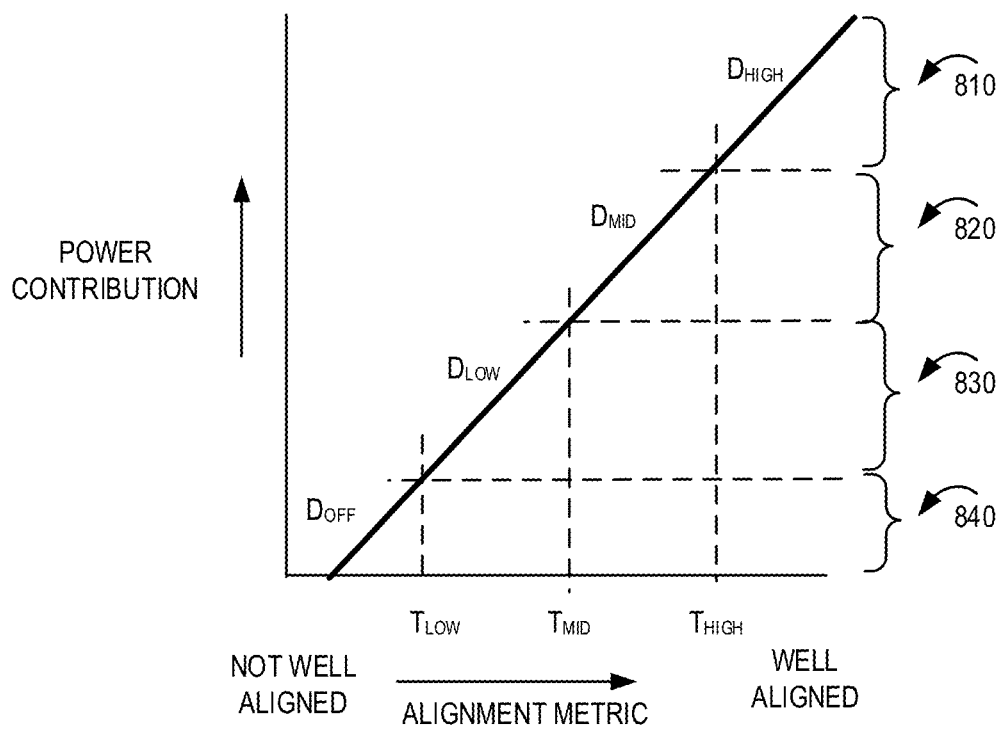
FIG. 8 shows a graph of another example dynamic droop configuration based on an alignment metric according to some implementations.

FIG. 8 shows a graph of another example dynamic droop configuration based on an alignment metric according to some implementations. The graph provides a visual representation how an alignment metric may be used to select from a plurality of droop configurations. Examples of the alignment metric may include a signal strength measurement, a quality factor measurement, or a magnetic field measurement, among other examples. In some implementations, the alignment metric may be determined based on a difference between a transmit power indicated in a communication from the wireless power transmission apparatus and a received power measured by the wireless power reception apparatus. The alignment metric may indicate a scale from a low value indicating the TX-RX pair is not well aligned to a high value indicating the TX-RX pair is well aligned.

An RX controller may compare the alignment metric with one or more thresholds to determine which droop configuration to use for the RX circuit. For example, if the alignment metric is above a first threshold ($T_{HIGH}$), the RX controller may select a first droop configuration ($D_{HIGH}$) 810. If the alignment metric is below the first threshold but above a second threshold ($T_{MID}$), the RX controller may select a second droop configuration ($D_{MID}$) 820. If the alignment metric is below the second threshold but above a third threshold ($T_{LOW}$), the RX controller may select a third droop configuration ($D_{LOW}$) 830. If the alignment metric is below the third threshold, the RX controller may select a disabled droop configuration ($D_{OFF}$) 840. The disabled droop configuration may cause the RX circuit to discontinue receiving wireless power due to poor alignment.

The thresholds and droop configurations described in FIG. 8 are illustrative examples. In other implementations, a different quantity of thresholds and associated droop configurations could be used.

Figure 9:
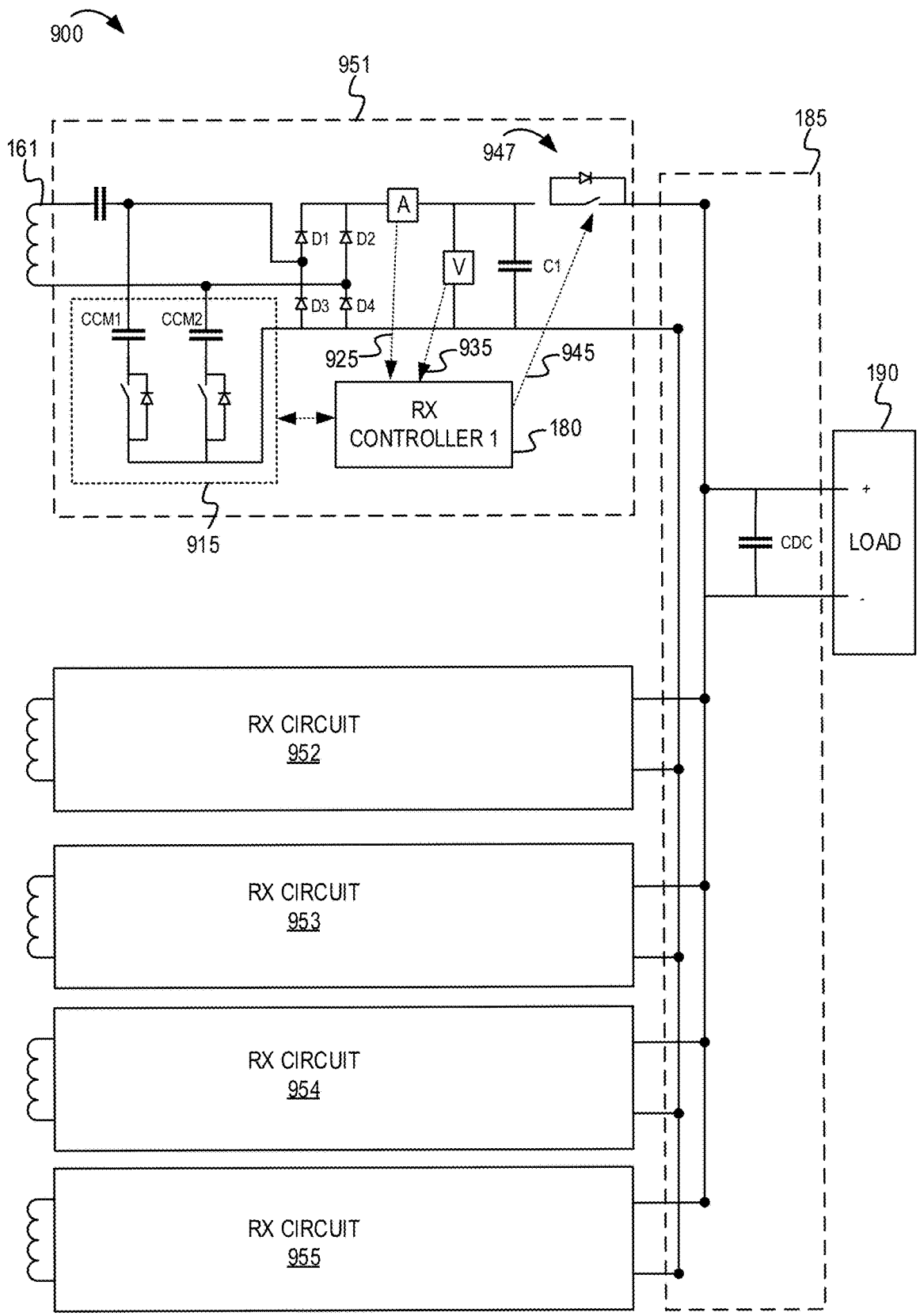
FIG. 9 shows an example wireless power receiving apparatus with multiple wireless power receivers connected in parallel according to some implementations.

FIG. 9 shows an example wireless power receiving apparatus 900 with multiple wireless power receivers connected in parallel according to some implementations. The example in FIG. 9 shows a collection of wireless power RX circuits 951, 952, 953, 954, and 955 arranged in a parallel circuit. The quantity of RX circuits is an example and other quantities, or arrangements, may be used in various implementations. Furthermore, while FIG. 9 shows a parallel circuit, it is possible to arrange the RX circuits in series or in a combined series-parallel arrangement, both of which are described in later Figures. The RX circuits 951, 952, 953, 954, and 955 are coupled to a power combination circuit 185 that provides a combined power signal to a load 190. The load 190 may be a battery charger or may be other components of an electrical device.

A first RX circuit 951 is shown with additional detail for example purposes. Each of the other RX circuits 952, 953, 954, and 955 may have similar components (not shown). In the wireless power RX circuits 951, a secondary coil 161 of the RX circuit 951 is configured to receive wireless power from a primary coil (not shown) of a TX circuit (not shown). An RX controller 180 may utilize a communication and control circuit 915 to detect a ping from the primary coil. The RX controller 180 also may communicate with the TX circuit by causing pulses or modulation in switches of the communication and control circuit 915. The RX controller 180 also may receive a current sense measurement 925, or a voltage sense measurement 935, or both. When a wireless power signal is detected, the RX controller 180 may enable a switch 947 (via an enable line 945) to allow power to flow to the power combination circuit 185. In some implementations, the switch 947 may be located in the power combination circuit 185 instead of the RX circuit 951. The RX controller 180 may use the voltage sense measurement 935 or the current sense measurement 925 to determine whether the first secondary coil 161 is aligned with a corresponding primary coil. In some implementations, the RX controller 180 also may determine an amount of power drawn by the load 190 and may cause an adjustment to the amount of power received by the first secondary coil 161. As described above, the RX controller 180 may use a droop configuration to determine the adjustment value. The RX controller 180 may cause a communication (via the communication and control circuit 915) to the primary coil to inform the adjustment value to the TX circuit. For example, the communication may cause the primary coil to decrease an amount of wireless power if the wireless power RX circuits 951 is producing more current than it should be based on power sharing among all the RX circuits. For example, each RX controller 180 may use a droop configuration, such as those described in FIGS. 5-8.

Each of the RX circuits 951, 952, 953, 954, and 955 (either independently or by a supervisory controller, not shown) may adjust how much power is transferred by their respective secondary coil based on the total power drawn by the RX controller 180. In some implementations, each of the activated RX circuits may use a same power for the wireless power transfer at their respective secondary coils. In some implementations, the RX circuits may provide different power levels (based on different droop configurations) based on how efficient the wireless power transfer is for each secondary coil.

Figure 10:
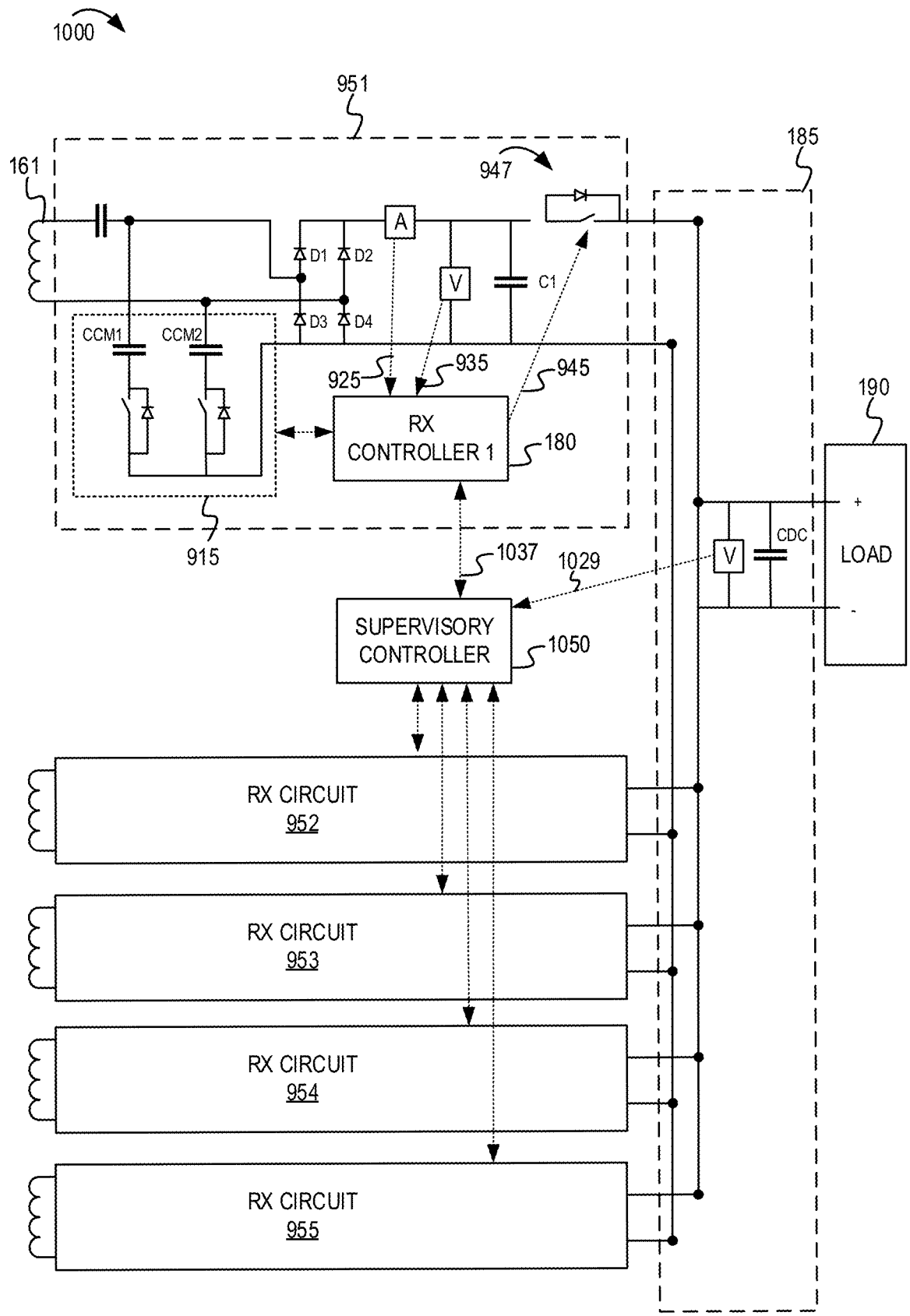
FIG. 10 shows an example wireless power receiving apparatus with a supervisory controller according to some implementations.

FIG. 10 shows an example wireless power receiving apparatus 1000 with a supervisory controller according to some implementations. The wireless power receiving apparatus 1000 is similar to the wireless power receiving apparatus 900 described in FIG. 9. For example, the wireless power receiving apparatus 1000 includes a collection of wireless power RX circuits 951, 952, 953, 956, and 955 arranged in a parallel circuit. Different from the wireless power receiving apparatus 900 in FIG. 9, the wireless power receiving apparatus 1000 includes a supervisory controller 1050 (which also may be referred to as a master controller).

The supervisory controller 1050 may communicate with the RX controllers in each of the RX circuits 951, 952, 953, 956, and 955. For example, the supervisory controller 1050 is shown with a communication link 1037 to the RX controller 180 of the wireless power RX circuits 951. The supervisory controller 1050 may have communication links to the RX controllers (not shown) of the other RX circuits 952, 953, 956, and 955. The supervisory controller 1050 may collect some information from the RX controllers. For example, while most of the control and communication for each RX circuit is managed by the RX controllers, the supervisory controller 1050 may collect some information regarding which RX circuits are coupled with corresponding TX circuits (not shown). The supervisory controller 1050 may receive an indicator or value from each RX controller regarding how well aligned the RX circuit is with its corresponding TX circuit. The supervisory controller 1050 may regulate the overall load voltage based on a fixed or variable value. For example, the supervisory controller 1050 may determine the voltage output 1029 that is needed by the load 190. The supervisory controller 1050 may determine how much power (such as voltage or current) that each of the RX circuits 951, 952, 953, 956, and 955 should contribute to the power combination circuit 185 to support the load 190. The supervisory controller 1050 may disable power from one or more RX circuits when an excess numbers of RX circuits are coupled. For example, when less power is needed by the load 190, the supervisory controller 1050 may inform one or more of the RX controllers to disable power transfer from its corresponding RX circuit to improve overall load operating efficiency of the RX circuits that remain enabled. The supervisory controller 1050 may select which RX circuit(s) to disable based on the alignment metric or power transfer efficiency metric obtained from each of the RX controllers. In some implementations, the supervisory controller 1050 may provide a protective function to prevent overload or over temperature malfunctions in the RX circuits.

In some implementations, the supervisory controller 1050 may be directly connected to voltage or ampere measurement units in each of the RX circuits. For example, although FIG. 10 shows the RX controller 180 receiving a current sense measurement 925, or a voltage sense measurement 935, or both, in some implementations, the supervisory controller 1050 may receive the current sense measurement 925, or the voltage sense measurement 935, or both. In some implementations, each of the RX controllers implement the droop configuration as described above. Alternatively, or additionally, the supervisory controller 1050 may implement the droop configuration and send current error (or voltage error) values to the RX controllers.

Figure 11:
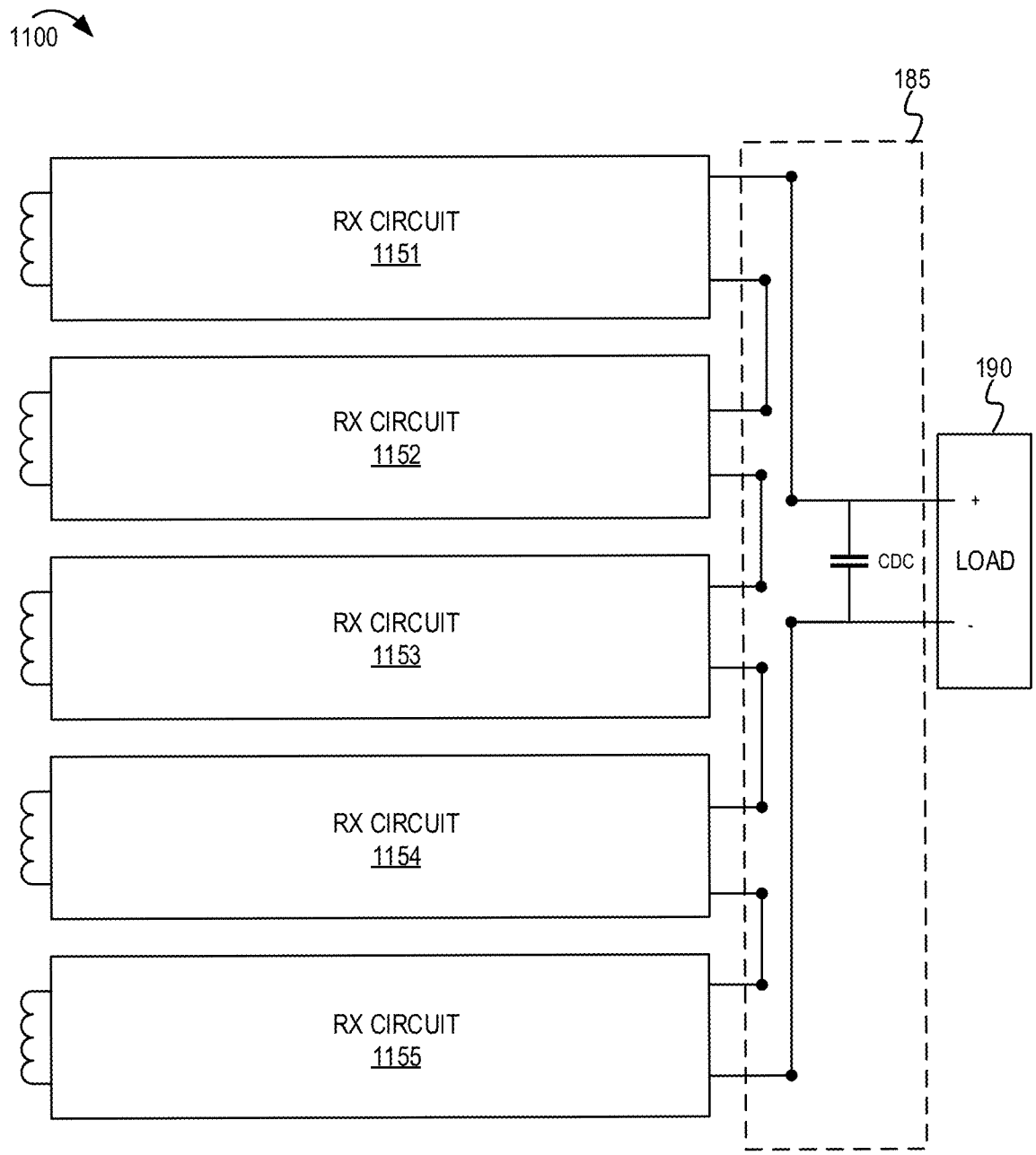
FIG. 11 shows an example wireless power receiving apparatus with multiple wireless power receivers connected in series according to some implementations.

FIG. 11 shows an example wireless power receiving apparatus 1100 with multiple wireless power receivers connected in series according to some implementations. The wireless power receiving apparatus 1100 may include a collection of RX circuits 1151, 1152, 1153, 1154, and 1155 that are connected in series. For example, the power combination circuit 185 may be connected to a first RX circuit 1151 and a last RX circuit 1155, while each of the other RX circuits 1152, 1153, and 1154 are connected in series between the first RX circuit 1151 and the last RX circuit 1155.

Figure 12:
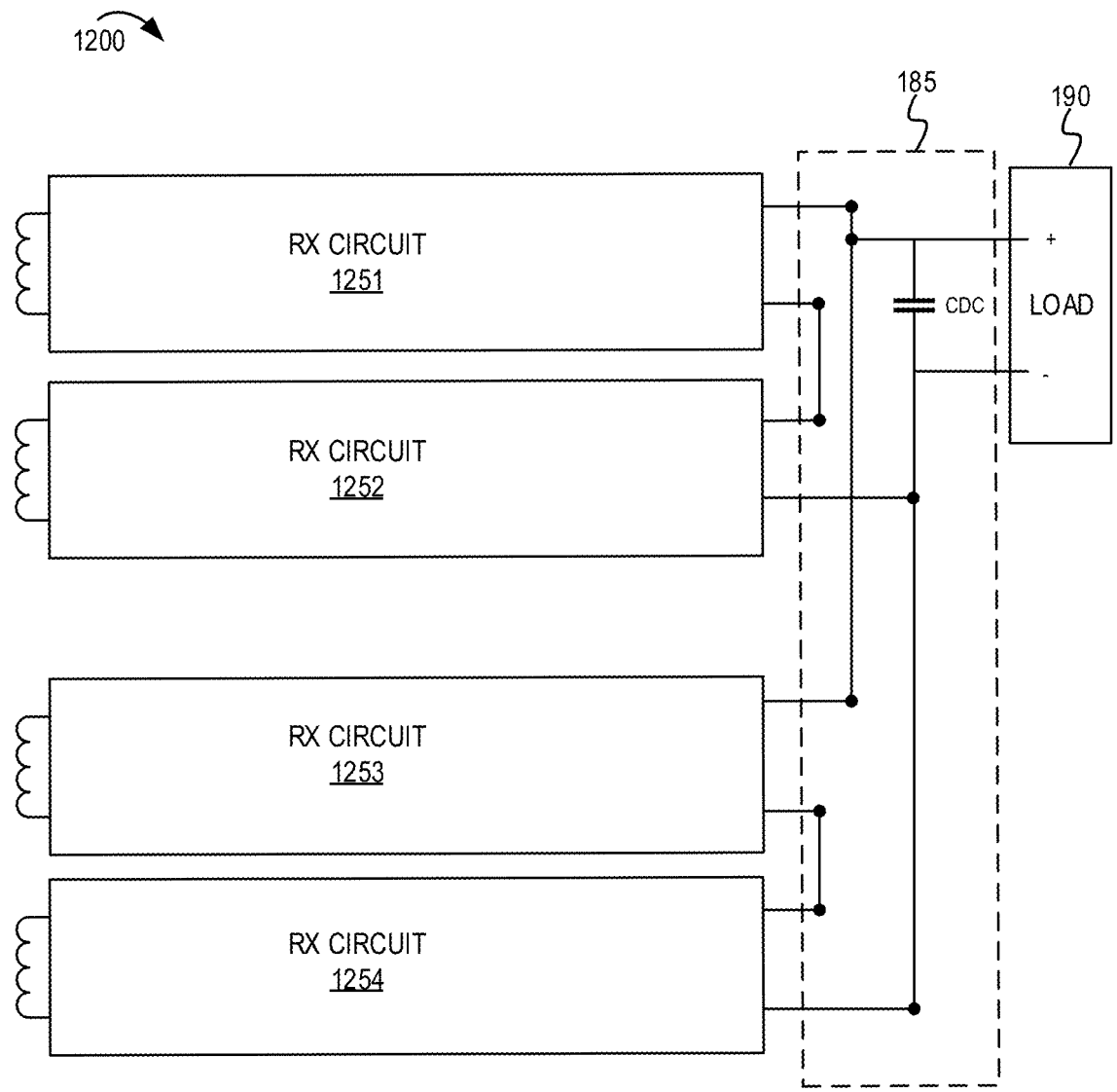
FIG. 12 shows an example wireless power receiving apparatus with multiple wireless power receivers connected in series and parallel according to some implementations.

FIG. 12 shows an example wireless power receiving apparatus 1200 with multiple wireless power receivers connected in series and parallel according to some implementations. The wireless power receiving apparatus 1200 may include a collection of RX circuits 1251, 1252, 1253, and 1254. Various combination of series and parallel circuits in the power combination circuit 185 may support different combinations of the RX circuits 1251, 1252, 1253, and 1254. For example, a first set of RX circuits 1251 and 1252 may be connected in series with each other. A second set of RX circuits 1253 and 1254 may be connected in series with each other. The first set of 1251 and 1252 and the second set of RX circuits 1253 and 1254 RS may be connected in parallel. In some implementations, switches (not shown) in the power combination circuit 185 may control which RX circuits are coupled to the load 190 in series or parallel.

Figure 13:
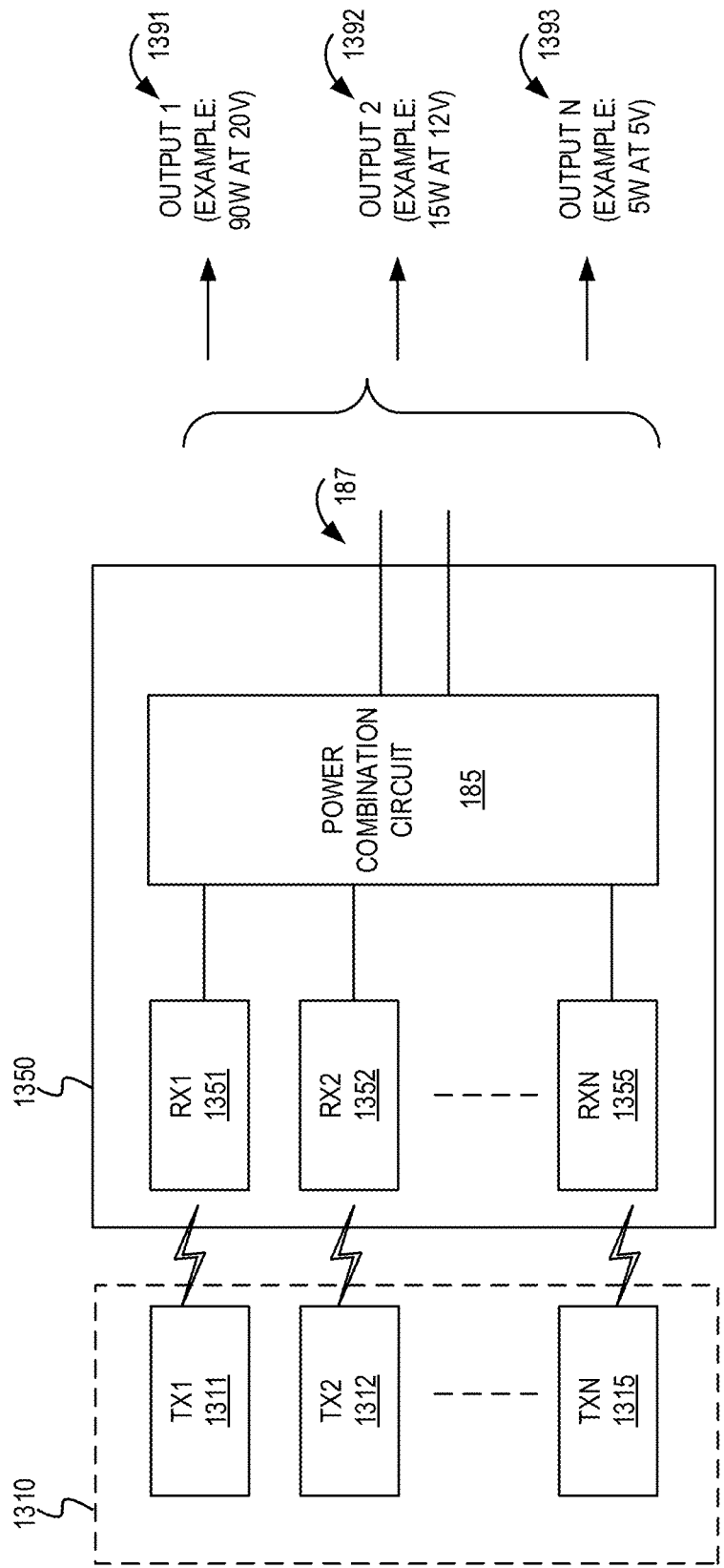
FIG. 13 shows an example wireless power receiving apparatus capable of producing a power output with different power ratings according to some implementations.

FIG. 13 shows an example wireless power receiving apparatus 1350 capable of producing a power output with different power ratings according to some implementations. For example, the wireless power receiving apparatus 1350 may include multiple RX circuits 1351, 1352, 1355 (labeled $RX_1$ to $RX_N$). The RX circuits 1351, 1352, 1355 may be capable of receiving wireless power from different TX circuits, such as TX circuits 1311, 1312, and 1315 (labeled $TX_1$ to $TX_N$). Although FIG. 13 shows the TX circuits 1311, 1312, and 1315 in the same wireless power transmitting apparatus 1310, they may be in different wireless power transmitting apparatuses. The power combination circuit 185 may be capable of combining power from the RX circuits 1351, 1352, 1355. In some implementations, each of the RX circuits 1351, 1352, 1355 may be configured with droop configurations as described above.

The power combination circuit 185 may provide a power output 187 for connection to a load (not shown). The power output 187 may support different power ratings. For example, the power output 187 may support a first output level 1391 (such as 90 Watts at 20 Volts), a second output level 1391 (such as 15 Watts at 12 Volts), or a third output level 1393 (such as 5 Watts at 5 Volts) depending on what type of device is connected to the power output 187. In some implementations, the droop configuration used by each of the RX circuits 1351, 1352, 1355 may be selected by the power combination circuit 185 or a supervisory controller (not shown) and communicated to the RX controllers in each of the RX circuits 1351, 1352, 1355. The droop configuration may be based on the output level needed for the power output 187.

In some implementations, the wireless power receiving apparatus 1350 may be an apparatus that supports one or more different types of devices such as laptops, tablets, mobile phones, or wearable devices, among other examples. In some implementations, the power output 187 supports connection to a legacy device that does not support wireless charging but has a wired power input port. For example, the wireless power receiving apparatus 1350 may be a sleeve, pad, cover, or case that can add wireless charging capability to a legacy device. The wireless power receiving apparatus 1350 may implement wireless power transfer by collecting wireless power at the RX circuits 1351, 1352, 1355 and delivering an output power via the power output 187 to a connected device. In some implementations, the wireless power receiving apparatus 1350 may be advantageous even if the connected device supports wireless charging. For example, the wireless charging capability of the connected device may be disabled and a wired connection to the power output 187 may be used to power the connected device. Because the wireless power receiving apparatus 1350 (instead of the connected device) is used to collect the wireless power from the TX circuits 1311, 1312, and 1315, the wireless power receiving apparatus 1350 may protect the connected device from thermal issues or may increase the power delivery to the connected device. In some implementations, the wireless power receiving apparatus 1350 may increase charging speed since the connected device can draw a higher power from the wireless power receiving apparatus 1350 via a wired connection and the wireless power receiving apparatus 1350 can aggregate wireless power received from multiple TX circuits.

In some implementations, the wireless power receiving apparatus 1350 may be a multi-port apparatus. For example, while only one power output 187 is shown in FIG. 13, the power combination circuit 185 may be capable of providing multiple power outputs (not shown) to concurrently charge more than one connected device. In some implementations, each power output may support a different power rating such as the output levels 1391, 1392, and 1393.

Figure 14:
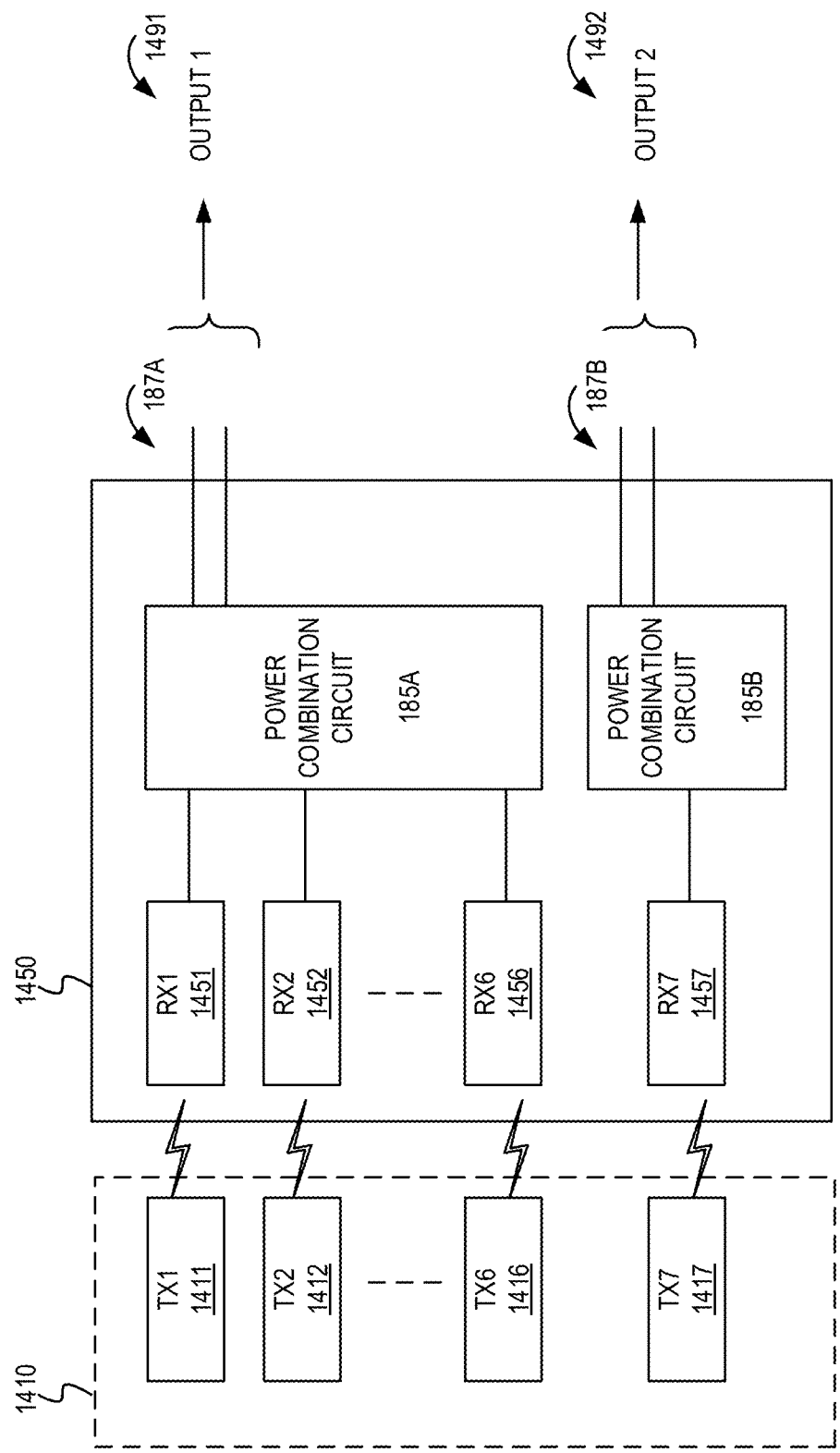
FIG. 14 shows an example wireless power receiving apparatus capable of producing multiple power outputs according to some implementations.

FIG. 14 shows an example wireless power receiving apparatus 1450 capable of producing multiple power outputs according to some implementations. The wireless power receiving apparatus 1450 may include seven RX circuits (labeled $RX_1$ to $RX_7$). The RX circuits 1451, 1452, 1456, 1457 may be capable of receiving wireless power from different TX circuits, such as TX circuits 1411, 1412, 1416, and 1317 (labeled $TX_1$ to $TX_7$). Although FIG. 14 shows the TX circuits in the same wireless power transmitting apparatus 1410, they may be in different wireless power transmitting apparatuses. The wireless power receiving apparatus 1450 may include a first power combination circuit 185A and a second power combination circuit 185B. The first power combination circuit 185A may provide a first power output 187A and the second power combination circuit 185B may provide a second power output 187B.

Although only 4 RX circuits 1451, 1452, 1456 and 1457 are shown for brevity, this disclosure includes a description in which 7 RX circuits may be used. In the example, each of the RX circuits may be 15-Watt receivers. Six RX circuits 1451 to 1456 ($RX_1$ to $RX_6$) may be 15-Watt receivers that are connected in parallel to the first power combination circuit 185A. The first power combination circuit 185A may provide a 90-Watt output to a high-power electronic device, such as a laptop. A seventh RX circuit 1457 ($RX_7$) may be connected to the second power combination circuit 185B to provide a 15-Watt output to a lower power electronic device, such a s mobile device.

In some implementations, the wireless power receiving apparatus 1450 may have a supervisory controller (not shown) that is configured to select how many RX circuits to dynamically connect in parallel to each of the power combination circuits 185A and 185B. For example, depending on the charging state for each of the power outputs 187A and 187B, the supervisory controller may control switches that enable or disable connections between the RX circuits and the power combination circuits.

Figure 15:
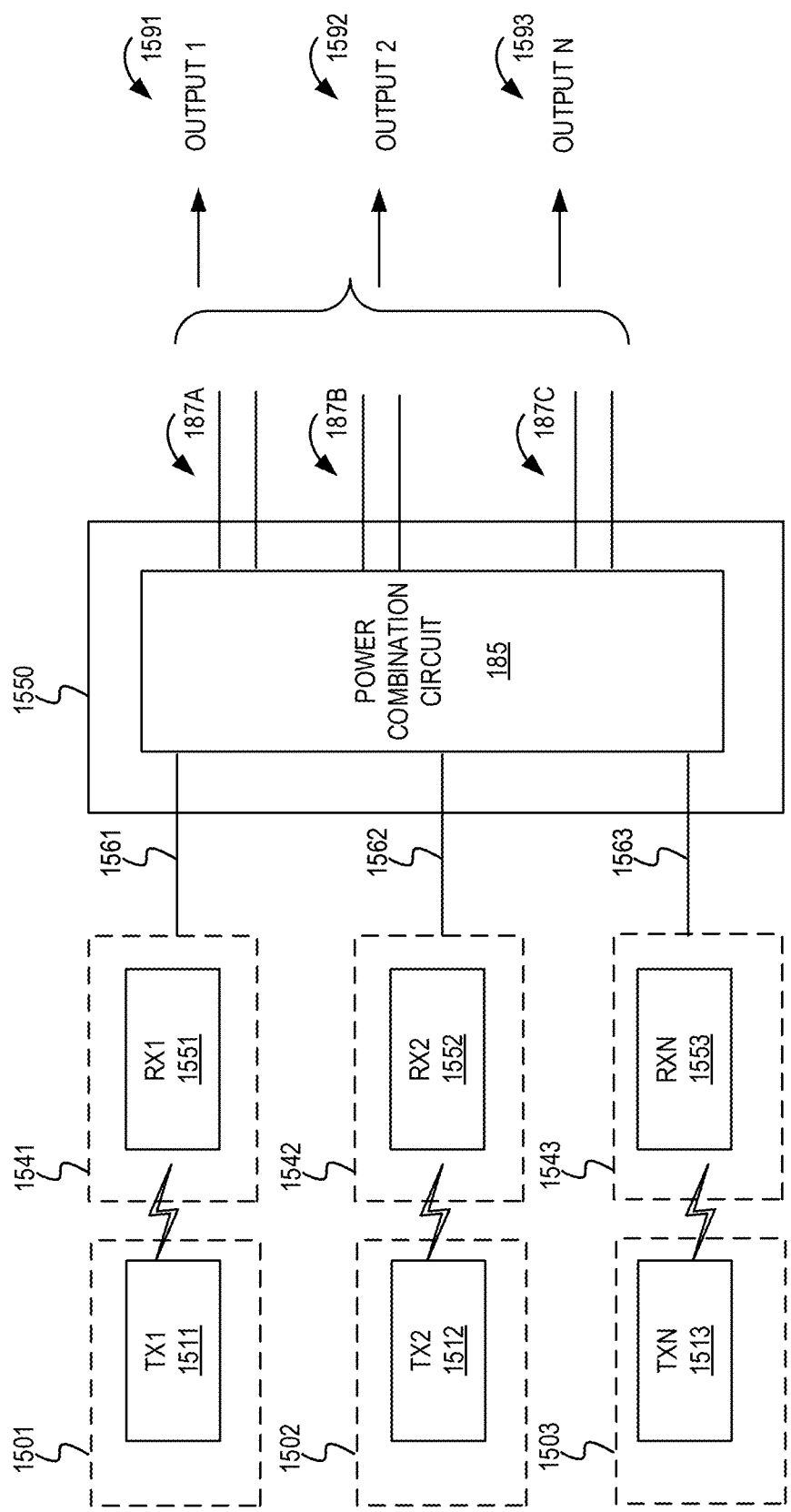
FIG. 15 shows an example wireless power receiving apparatus that utilizes external wireless power receivers according to some implementations.

FIG. 15 shows an example wireless power receiving apparatus 1550 that utilizes external wireless power receivers according to some implementations. For example, the wireless power receiving apparatus 1550 may include a power combination circuit 185 that can produce one or more power outputs 187A, 187B and 187C having different output levels 1591, 1592, and 1593. However, different from FIGS. 13-14, the wireless power receiving apparatus 1550 may support input connections 1561, 1562, and 1563 from external RX circuits 1551, 1552, and 1553, respectively. The input connections 1561, 1562, and 1563 may permit the power combination circuit 185 of the wireless power receiving apparatus 1550 to receive power from external power receivers and aggregate the power to support a different (or higher) power output than would be possible by each of the RX circuits individually.

The RX circuits 1551, 1552, and 1553 may be in different receiver units 1541, 1542 and 1543. The RX circuits 1551, 1552, and 1553 may be configured to receive wireless power from different TX circuits 1511, 1512, and 1513. The TX circuits 1511, 1512, and 1513 may be in different wireless power transmitting apparatuses 1501, 1502 and 1503. As with other examples in this disclosure, the quantity and locations of the TX circuits and RX circuits may vary in different designs.

Figure 16:
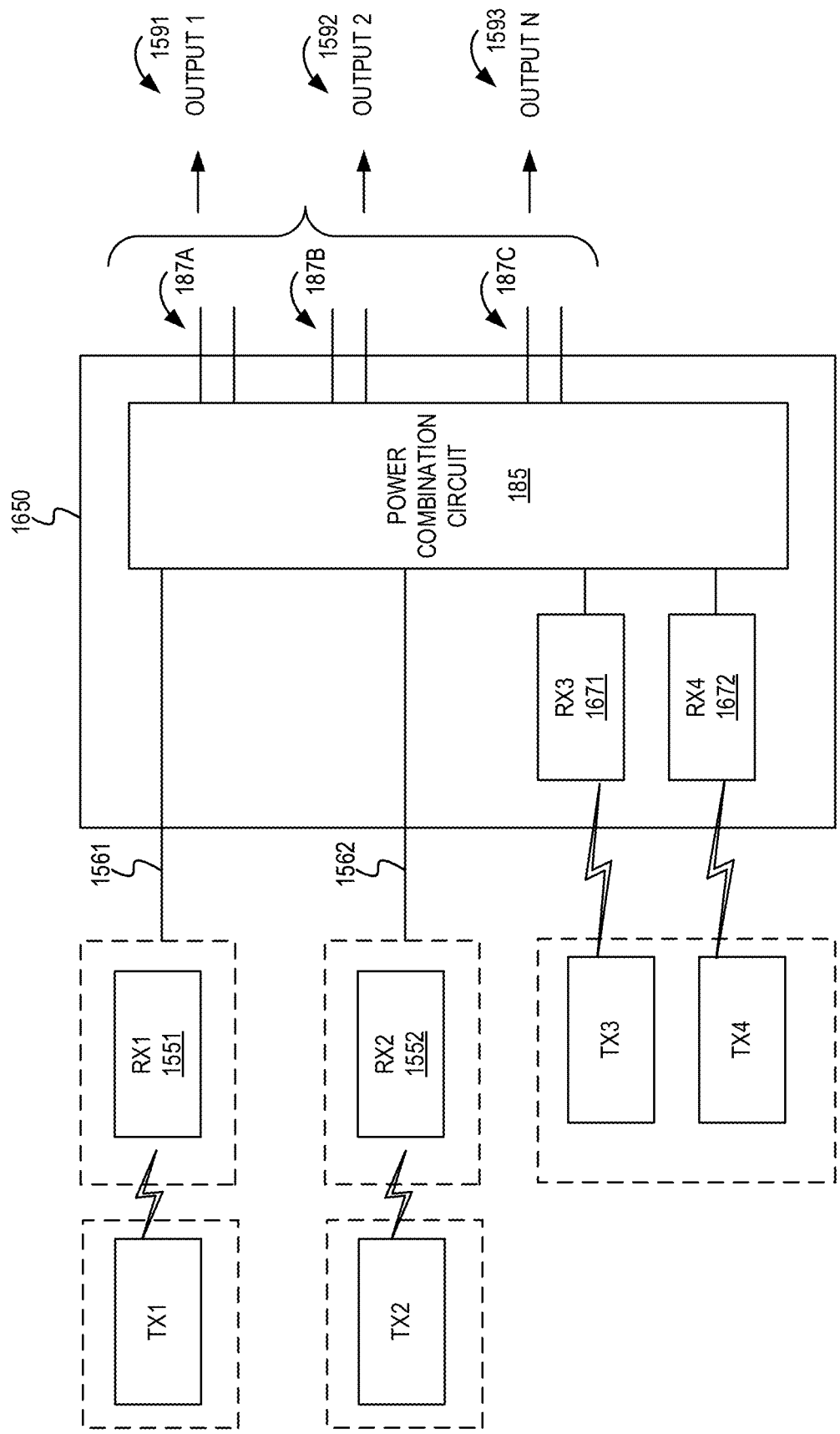
FIG. 16 shows an example wireless power receiving apparatus that can utilize internal and external wireless power receivers according to some implementations.

FIG. 16 shows an example wireless power receiving apparatus 1650 that can utilize internal and external wireless power receivers according to some implementations. The wireless power receiving apparatus 1650 may include a power combination circuit 185 that can produce one or more power outputs 187A, 187B and 187C having different output levels 1591, 1592, and 1593. The wireless power receiving apparatus 1650 may support both the external wireless power RX circuits 1551 and 1552, as described with reference to FIG. 15) as well as internal wireless power RX circuits 1671 and 1672.

Figure 17:
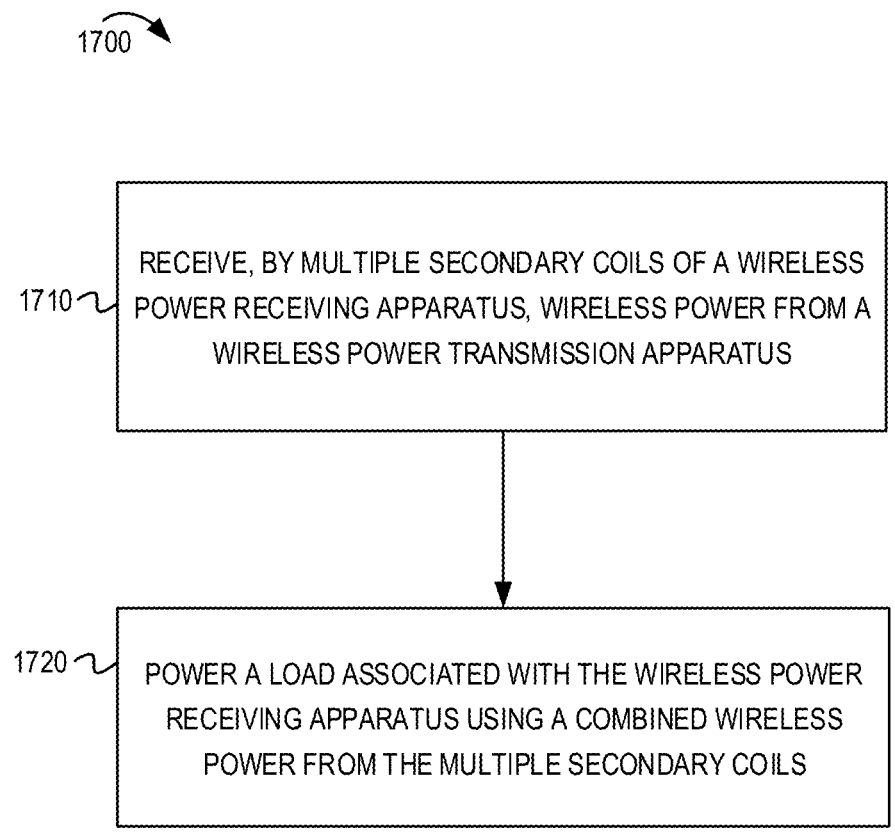
FIG. 17 shows a flowchart illustrating an example process for wireless power transmission according to some implementations.

FIG. 17 shows a flowchart illustrating an example process for wireless power transmission according to some implementations. The flowchart 1700 begins at block 1710. At block 1710, the process includes receiving, by multiple secondary coils of a wireless power receiving apparatus, wireless power from a wireless power transmission apparatus. For example, the wireless power receiving apparatus may rectify wireless power at each of the multiple secondary coils. The wireless power receiving apparatus may combine the rectified wireless power to prepare the combined wireless power. At block 1720, the process includes powering a load associated with the wireless power receiving apparatus using a combined wireless power from the multiple secondary coils.

In some implementations, the wireless power receiving apparatus may determine which secondary coils from among a plurality of secondary coils to use to receive wireless power based, at least in part, on a proximity of the secondary coils to corresponding primary coils of the wireless power transmission apparatus. For example, the selection of secondary coils may be based on communication with a corresponding primary coil. In some implementations, the secondary coil may be used to determine a power transfer efficiency (such as a quality metric). The power transfer efficiently (such as the quality metric) may be communicated to the wireless power transmission apparatus. If the power transfer efficiency is below a threshold, the wireless power transmission apparatus may determine that a secondary coil is not well aligned and may deactivate the corresponding primary coil.

Figure 18:
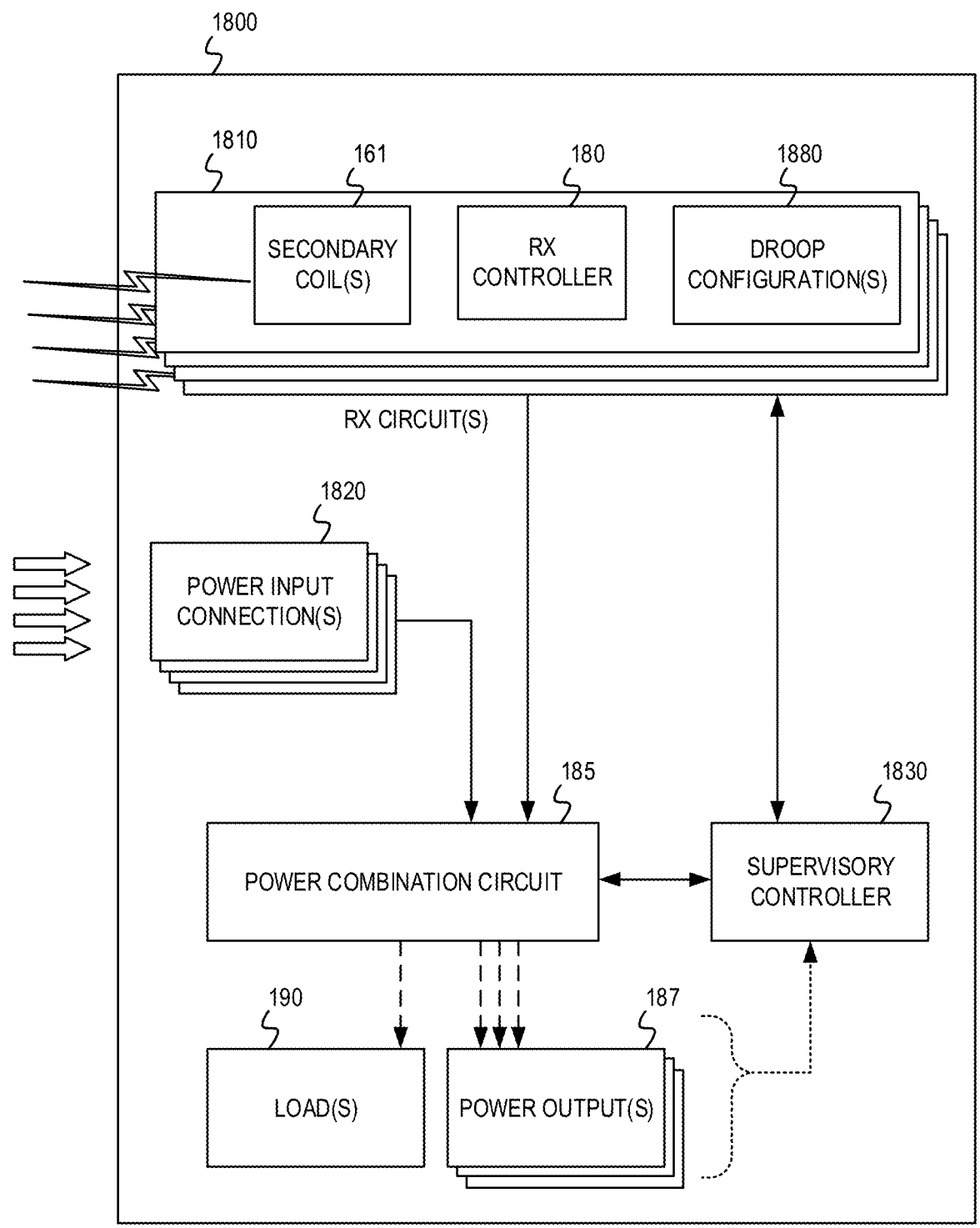
FIG. 18 shows a block diagram of an example wireless power receiving apparatus according to some implementations.

FIG. 18 shows a block diagram of an example wireless power receiving apparatus 1800 according to some implementations. The wireless power receiving apparatus 1800 may include zero, one, or more RX circuits 1810. Each RX circuit 1810 may have one or more secondary coils 161 and an RX controller 180. In some implementations, each RX circuit 1810 is configured with one or more droop configurations 1880 to determine an amount of power that each RX circuit 1810 should contribute to a power combination circuit 185.

The wireless power receiving apparatus 1800 may have zero, one, or more power input connections 1820 for receiving power from an externally connected RX circuit. The power combination circuit 185 may combine power received from the RX circuits (either from the internal RX circuits 1810, or the external RX circuits, or both). In some implementations, the power combination circuit 185 may provide power to an internal load 190 (such as a battery). In some implementations, the power combination circuit 185 may provide power to one or more power outputs 187. In some implementations, the wireless power receiving apparatus 1800 may include both an internal load 190 and one or more power outputs 187.

In some implementations, a supervisory controller 1830 may determine how much power is needed. For example, the supervisory controller 1830 may determine the power requirements from the load 190, the power outputs 187, or both. In some implementations, the supervisory controller 1830 may communicate with the power combination circuit 185. The supervisory controller 1830 may enable or disable different ones of the RX circuits (such as the RX circuits 1810) based on the power requirement. In some implementations, the supervisory controller 1830 may select which droop configuration 1880 should be used by one or more of the RX circuits. In some other implementations, the droop configuration 1880 may be stored at the supervisory controller 1830, and the supervisory controller 1830 may communicate the power sharing values to each RX circuit.

Figure 19:
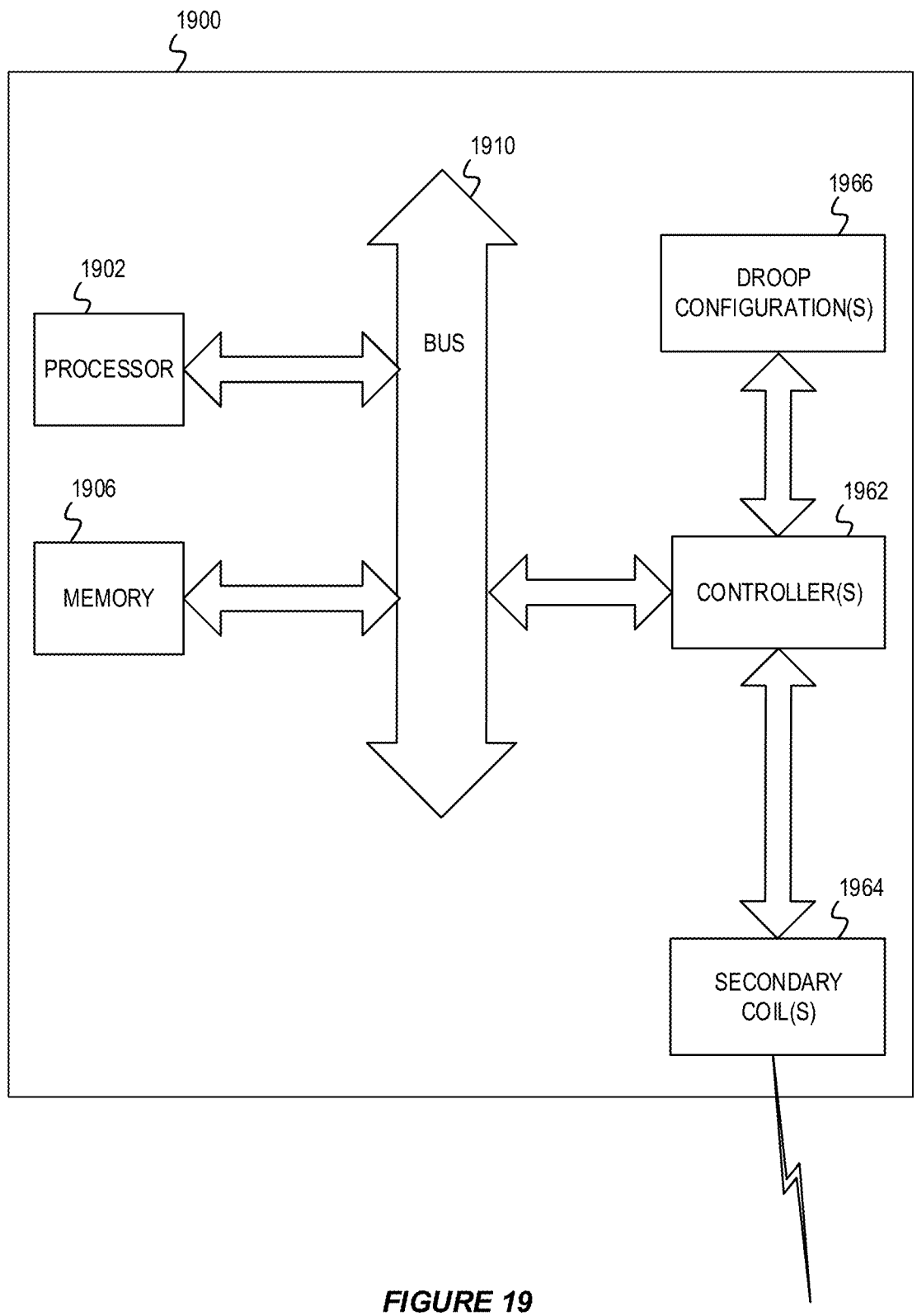
FIG. 19 shows a block diagram of an example apparatus for use in wireless power system according to some implementations.

FIG. 19 shows a block diagram of an example apparatus for use in wireless power system according to some implementations. In some implementations, the apparatus 1900 may be a wireless power transmission apparatus (such as the wireless power transmission apparatus 110) or a wireless power receiving apparatus (such as the wireless power receiving apparatus 150). The apparatus 1900 can include a processor 1902 (possibly including multiple processors, multiple cores, multiple nodes, or implementing multi-threading, etc.). The apparatus 1900 also can include a memory 1906. The memory 1906 may be system memory or any one or more of the possible realizations of computer-readable media described herein. The apparatus 1900 also can include a bus 1910 (such as PCI, ISA, PCI-Express, HyperTransport®, InfiniBand®, NuBus,® AHB, AXI, etc.).

The apparatus 1900 may include one or more controller(s) 1962 configured to manage multiple secondary coils (such as a receive coil array). In some implementations, the controller(s) 1962 can be distributed within the processor 1902, the memory 1906, and the bus 1910. The controller(s) 1962 may perform some or all of the operations described herein. For example, the controller(s) 1962 may be programmed with droop configurations 1966 for determining an amount of power from each of the secondary coils 1964. In some implementations, the droop configurations 1966 may be stored in the memory 1906.

The memory 1906 can include computer instructions executable by the processor 1902 to implement the functionality of the implementations described in FIGS. 1-18. Any one of these functionalities may be partially (or entirely) implemented in hardware or on the processor 1902. For example, the functionality may be implemented with an application specific integrated circuit, in logic implemented in the processor 1902, in a co-processor on a peripheral device or card, etc. Further, realizations may include fewer or additional components not illustrated in FIG. 19. The processor 1902, the memory 1906, and the controller(s) 1962 may be coupled to the bus 1910. Although illustrated as being coupled to the bus 1910, the memory 1906 may be coupled to the processor 1902.

FIGS. 1-19 and the operations described herein are examples meant to aid in understanding example implementations and should not be used to limit the potential implementations or limit the scope of the claims. Some implementations may perform additional operations, fewer operations, operations in parallel or in a different order, and some operations differently.

As used herein, a phrase referring to "at least one of" or "one or more of" a list of items refers to any combination of those items, including single members. For example, "at least one of: a, b, or c" is intended to cover the possibilities of: a only, b only, c only, a combination of a and b, a combination of a and c, a combination of b and c, and a combination of a and b and c.

The various illustrative components, logic, logical blocks, modules, circuits, operations and algorithm processes described in connection with the implementations disclosed herein may be implemented as electronic hardware, firmware, software, or combinations of hardware, firmware or software, including the structures disclosed in this specification and the structural equivalents thereof. The interchangeability of hardware, firmware and software has been described generally, in terms of functionality, and illustrated in the various illustrative components, blocks, modules, circuits and processes described above. Whether such functionality is implemented in hardware, firmware or software depends upon the particular application and design constraints imposed on the overall system.

The hardware and data processing apparatus used to implement the various illustrative components, logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, or, any conventional processor, controller, microcontroller, or state machine. A processor also may be implemented as a combination of computing devices, for example, a combination of a DSP and a microprocessor, multiple microprocessors, one or more microprocessors in conjunction with a DSP core, or any other such configuration. In some implementations, particular processes, operations and methods may be performed by circuitry that is specific to a given function.

As described above, in some aspects implementations of the subject matter described in this specification can be implemented as software. For example, various functions of components disclosed herein, or various blocks or steps of a method, operation, process or algorithm disclosed herein can be implemented as one or more modules of one or more computer programs. Such computer programs can include non-transitory processor- or computer-executable instructions encoded on one or more tangible processor- or computer-readable storage media for execution by, or to control the operation of, data processing apparatus including the components of the devices described herein. By way of example, and not limitation, such storage media may include RAM, ROM, EEPROM, CD-ROM or other optical disk storage, magnetic disk storage or other magnetic storage devices, or any other medium that may be used to store program code in the form of instructions or data structures. Combinations of the above should also be included within the scope of storage media.

Various modifications to the implementations described in this disclosure may be readily apparent to persons having ordinary skill in the art, and the generic principles defined herein may be applied to other implementations without departing from the scope of this disclosure. Thus, the claims are not intended to be limited to the implementations shown herein but are to be accorded the widest scope consistent with this disclosure, the principles and the novel features disclosed herein.

Additionally, various features that are described in this specification in the context of separate implementations also can be implemented in combination in a single implementation. Conversely, various features that are described in the context of a single implementation also can be implemented in multiple implementations separately or in any suitable subcombination. As such, although features may be described above as acting in particular combinations, and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example processes in the form of a flowchart or flow diagram. However, other operations that are not depicted can be incorporated in the example processes that are schematically illustrated. For example, one or more additional operations can be performed before, after, simultaneously, or between any of the illustrated operations. In some circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

What is claimed is:

1. A wireless power receiving apparatus, comprising:
    a plurality of wireless power receiver (RX) circuits, wherein each RX circuit includes at least one secondary coil, each secondary coil being capable of receiving wireless power from a different primary coil of at least one wireless power transmission apparatus and providing a wireless power to a power combination circuit;
    one or more RX controllers connected to the plurality of RX circuits and including at least a first RX controller configured to control a first RX circuit of the plurality of RX circuits based on at least a first droop configuration that represents a relationship between a voltage level at the first RX circuit and an amount of current from the first RX circuit to the power combination circuit; and
    the power combination circuit electrically coupled to the plurality of RX circuits and configured to combine the wireless power from at least two RX circuits and to provide a combined wireless power to at least a first load.

2. The wireless power receiving apparatus of claim 1, wherein a single RX controller of the one or more RX controllers controls multiple RX circuits, and wherein the single RX controller is configured to control the multiple RX circuits based, at least in part, on different droop characteristics for the multiple RX circuits.

3. The wireless power receiving apparatus of claim 1, wherein the first RX controller is configured to:
    determine a measured voltage and a measured current of the wireless power provided by the first RX circuit to the power combination circuit;
    determine an expected current based on measured voltage and the first droop configuration, wherein the first droop configuration indicates different expected current levels based on different measured voltages;

determine a current error value based on a difference between the expected current with the measured current; and cause the first RX circuit to communicate a feedback communication to a wireless power transmission apparatus based on the current error value, wherein the feedback communication is configured to cause the wireless power transmission apparatus to update an operating point of the wireless power transmitted by a first primary coil of the wireless power transmission apparatus to a first secondary coil of the first RX circuit.

4. The wireless power receiving apparatus of claim 1, wherein the first RX controller is configured to:

receive a transmitter communication from the wireless power transmission apparatus;

determine an alignment metric that indicates how well the first RX circuit is aligned with a first primary coil of the wireless power transmission apparatus; and select between the first droop configuration and a second droop configuration based on the alignment metric.

5. The wireless power receiving apparatus of claim 1, wherein each of the plurality of RX circuits is capable of receiving a low power wireless signal in accordance with a wireless charging standard, and wherein the power combination circuit is configured to provide the combined wireless power as a high-power signal to the first load.

6. The wireless power receiving apparatus of claim 5, wherein each low power wireless signal is not over 15 Watts, and wherein the high-power signal is over 15 Watts.

7. The wireless power receiving apparatus of claim 1, wherein each of the plurality of RX circuits is configured with a same droop configuration such that the each of the plurality of RX circuits contribute same amounts of wireless power to the power combination circuit when each of the plurality of RX circuits have a same degree of alignment.

8. The wireless power receiving apparatus of claim 1, wherein the plurality of RX circuits includes the first RX circuit and a second RX circuit, and wherein the first RX circuit and the second RX circuit contribute different amounts of wireless power to the power combination circuit based on different droop configurations or different alignments.

9. The wireless power receiving apparatus of claim 8, wherein the different amounts of wireless power are based, at least in part, on differences between the first droop configuration for a first alignment of a first secondary coil of the first RX circuit with a first primary coil and a second droop configuration for a second alignment of a second secondary coil of the second RX circuit with a second primary coil.

10. The wireless power receiving apparatus of claim 1, wherein the plurality of RX circuits is connected in parallel with each other and to the power combination circuit.

11. The wireless power receiving apparatus of claim 1, wherein the plurality of RX circuits is connected in series such that the first RX circuit and a last RX circuit are connected to the power combination circuit.

12. The wireless power receiving apparatus of claim 1, wherein a first set of RX circuits of the plurality of RX circuits are connected in series with each other, and a second set of RX circuits of the plurality of RX circuits are connected in series, and wherein the first set of RX circuits and the second set of RX circuits are connected in parallel to the power combination circuit.

13. The wireless power receiving apparatus of claim 1, further comprising:

a set of switches that are configured to add or remove selected ones of the plurality of RX circuits to a parallel or series circuit before connecting the selected ones of the plurality of RX circuits to the power combination circuit.

14. The wireless power receiving apparatus of claim 1, further comprising:

at least one power output configured to provide the combined wireless power to the first load, wherein the first load is external to the wireless power receiving apparatus.

15. The wireless power receiving apparatus of claim 1, further comprising:

a plurality of power outputs including at least a first power output port and a second power output port.

16. The wireless power receiving apparatus of claim 15, wherein each of the plurality of power outputs are associated with different output power ratings.

17. The wireless power receiving apparatus of claim 1, further comprising:

a housing for the plurality of RX circuits, the housing configured to attach to an electronic device, wherein the first load includes a battery charger of the electronic device.

18. The wireless power receiving apparatus of claim 1, further comprising:

at least one supervisory controller configured to manage the plurality of RX circuits, the supervisory controller configured to determine when to enable or disable one or more of the plurality of RX circuits based on a respective droop configuration for an alignment between each RX circuit and a corresponding wireless power transmitter (TX) circuit.

19. The wireless power receiving apparatus of claim 18, wherein the supervisory controller is further configured to determine when to enable or disable the one or more of the plurality of RX circuits based on a power consumption of the first load and the combined wireless power.

20. The wireless power receiving apparatus of claim 1, further comprising:

at least one power input connection configured to receive power from an external RX circuit and provide the power to the power combination circuit.

21. The wireless power receiving apparatus of claim 1, wherein the power combination circuit is configured to provide a first power signal to the first load via a first power output and a second power signal to a second load via a second power output.

22. A method of a wireless power receiving apparatus, the method comprising:

receiving, by a plurality of wireless power receiver (RX) circuits, wireless power from at least one wireless power transmission apparatus, wherein each RX circuit includes at least one secondary coil to receive the wireless power from a different primary coil of the at least one wireless power transmission apparatus and provide the wireless power to a power combination circuit;

controlling, by at least a first RX controller, a first RX circuit of the plurality of RX circuits based on at least a first droop configuration that represents a relationship between a voltage level at the first RX circuit and an amount of current from the first RX circuit to the power combination circuit;

combining, by the power combination circuit, the wireless power received by the plurality of RX circuits to form a combined wireless power; and
providing the combined wireless power to at least a first load.

23. The method of claim 22, further comprising:
determining to deactivate the first RX circuit based, at least in part, on a misalignment of a first secondary coil in the first RX circuit with a first primary coil of a wireless power transmission apparatus.

24. The method of claim 22, further comprising:
deactivating one or more of the plurality of RX circuits based on a determination that the first load is using less power than the combined wireless power.

25. The method of claim 22, further comprising:
activating one or more of the plurality of RX circuits based on a determination to reduce an amount of wireless power contributed by each of the plurality of RX circuits.

26. The method of claim 22, further comprising:
providing a first wireless power from the power combination circuit to the first load via a first power output; and
providing a second wireless power from the power combination circuit to a second load via a second power output.

27. The method of claim 22, further comprising:
determining a measured voltage and a measured current of the wireless power provided by the first RX circuit to the power combination circuit;
determining an expected current based on the measured voltage and the first droop configuration, wherein the first droop configuration indicates different expected current levels based on different measured voltages;
determining a current error value based on a difference between the expected current and the measured current; and
causing the first RX circuit to communicate a feedback communication to a wireless power transmission apparatus based on the current error value, wherein the feedback communication is configured to cause the wireless power transmission apparatus to update an operating point of the wireless power transmitted by a first primary coil of the wireless power transmission apparatus to a first secondary coil the first RX circuit.

28. The method of claim 27, further comprising:
receiving a transmitter communication from the wireless power transmission apparatus;
determining an alignment metric that indicates how well the first RX circuit is aligned with the first primary coil of the wireless power transmission apparatus; and
selecting between the first droop configuration and a second droop configuration based on the alignment metric.

29. The wireless power receiving apparatus of claim 1, wherein the first RX controller comprises at least one of:
a processor and a memory, wherein the memory has stored thereon the first droop configuration;
logic circuitry configured to receive at least one voltage measurement and to generate at least one expected current value in accordance with the first droop configuration; or
a programmable logic device (PLD) configured to receive the at least one voltage measurement and to generate the at least one expected current value in accordance with the first droop configuration.

30. The wireless power receiving apparatus of claim 2, wherein the single RX controller is further configured to control the multiple RX circuits based, at least in part, on an alignment metric for each RX circuit.

* * * * *